US008482974B2

(12) United States Patent
Saito et al.

(10) Patent No.: US 8,482,974 B2
(45) Date of Patent: Jul. 9, 2013

(54) SEMICONDUCTOR MEMORY DEVICE AND METHOD FOR DRIVING THE SAME

(75) Inventors: Toshihiko Saito, Kanagawa (JP);
Takanori Matsuzaki, Kanagawa (JP);
Shuhei Nagatsuka, Kanagawa (JP);
Hiroki Inoue, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 235 days.

(21) Appl. No.: 13/022,292

(22) Filed: Feb. 7, 2011

(65) Prior Publication Data
US 2011/0199807 A1 Aug. 18, 2011

(30) Foreign Application Priority Data

Feb. 12, 2010 (JP) ................. 2010-028818

(51) Int. Cl.
*G11C 11/14* (2006.01)
(52) U.S. Cl.
USPC .............. 365/177; 365/149; 365/189.14
(58) Field of Classification Search
USPC ............... 365/177, 189.14, 149, 77, 189.141
See application file for complete search history.

(56) References Cited

U.S. PATENT DOCUMENTS

| 4,466,081 | A | 8/1984 | Masuoka |
| 5,349,366 | A | 9/1994 | Yamazaki et al. |
| 5,731,856 | A | 3/1998 | Kim et al. |
| 5,744,864 | A | 4/1998 | Cillessen et al. |
| 6,127,702 | A | 10/2000 | Yamazaki et al. |
| 6,294,274 | B1 | 9/2001 | Kawazoe et al. |
| 6,445,026 | B1 * | 9/2002 | Kubota et al. .......... 257/296 |
| 6,510,073 | B1 * | 1/2003 | Lee et al. .............. 365/145 |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

International Search Report, PCT Application No. PCT/JP2011/051377, dated Apr. 19, 2011, 3 pages.

(Continued)

*Primary Examiner* — Hoai V Ho
(74) *Attorney, Agent, or Firm* — Fish & Richardson P.C.

(57) ABSTRACT

A semiconductor device includes a first signal line, a second signal line, a memory cell, and a potential converter circuit. The memory cell includes a first transistor including a first gate electrode, a first source electrode, a first drain electrode, and a first channel formation region; a second transistor including a second gate electrode, a second source electrode, a second drain electrode, and a second channel formation region; and a capacitor. The first channel formation region and the second channel formation region include different semiconductor materials. The second drain electrode, one electrode of the capacitor, and the first gate electrode are electrically connected to one another. The second gate electrode is electrically connected to the potential converter circuit through the second signal line.

27 Claims, 23 Drawing Sheets

U.S. PATENT DOCUMENTS

| | | |
|---|---|---|
| 7,221,616 B2 | 5/2007 | Jeon |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0281071 A1* | 12/2005 | Jeon ............... 365/145 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0276689 A1 | 11/2010 | Iwasaki |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-53164 A | 2/2001 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-004592 A | 1/2006 |
| JP | 2006-338729 A | 12/2006 |
| JP | 2007-103918 A | 4/2007 |
| WO | 2004/114391 A1 | 12/2004 |
| WO | 2007/029844 A1 | 3/2007 |

OTHER PUBLICATIONS

Written Opinion, PCT Application No. PCT/JP2011/051377, dated Apr. 19, 2011, 4 pages.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display with Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

* cited by examiner

FIG. 15A
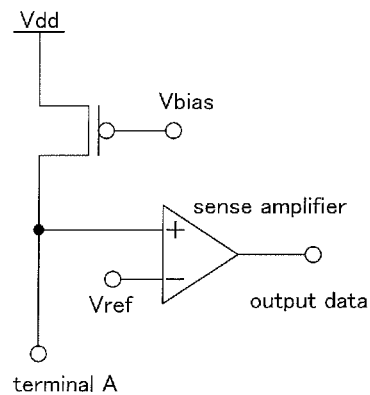
FIG. 15B
FIG. 15C
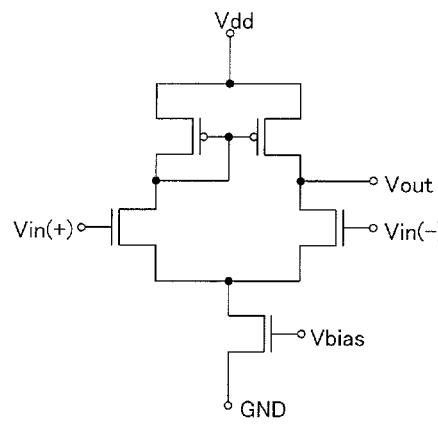
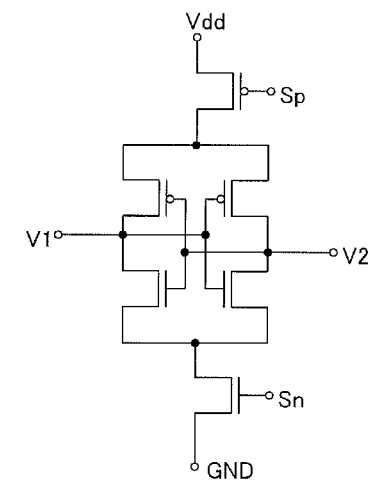

SEMICONDUCTOR MEMORY DEVICE AND METHOD FOR DRIVING THE SAME

TECHNICAL FIELD

The disclosed invention relates to a semiconductor device using a semiconductor element and a method for driving the semiconductor device.

BACKGROUND ART

Memory devices using semiconductor elements are broadly classified into two categories: a volatile device that loses stored data when not powered, and a non-volatile device that holds stored data even when not powered.

A typical example of a volatile memory device is a dynamic random access memory (DRAM). A DRAM stores data in such a manner that a transistor included in a memory element is selected and charge is accumulated in a capacitor.

Owing to the above principle, charge in the capacitor is lost when data in a DRAM is read out; thus, another writing operation is necessary every time data is read out. Moreover, since leakage current (off-state current) flows between a source and a drain of a transistor included in a memory element when the transistor is in an off state, charge flows into or out even if the transistor is not selected, which makes a data holding period short. For that reason, another writing operation (refresh operation) is necessary at predetermined intervals, and it is difficult to adequately reduce power consumption. Furthermore, since stored data is lost when power supply stops, another memory device utilizing a magnetic material or an optical material is needed in order to hold the data for a long time.

Another example of a volatile memory device is a static random access memory (SRAM). An SRAM holds stored data by using a circuit such as a flip-flop and thus does not need refresh operation, which is an advantage over a DRAM. However, cost per storage capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary in a volatile memory device is not needed (e.g., see Patent Document 1).

However, in a flash memory, there is a problem in that a memory element does not function after a predetermined number of writing operations because a gate insulating layer included in the memory element deteriorates due to tunneling current generated in writing operations. In order to reduce effects of this problem, a method in which the number of writing operations is equalized among the memory elements can be employed, for example, but a complicated peripheral circuit is needed to employ this method. Moreover, even when such a method is employed, the fundamental problem about the lifetime is not resolved. In other words, a flash memory is not suitable for applications in which data is frequently rewritten.

In addition, high voltage is necessary for holding charge in the floating gate or removing the charge, and a circuit therefor is required. Further, it takes a relatively long time to inject or remove charge, and it is not easy to increase a speed of writing and erasing data.

REFERENCE

Patent Document

[Patent Document 1] Japanese Published Patent Application No. S57-105889

DISCLOSURE OF INVENTION

In view of the foregoing problems, an object of one embodiment of the disclosed invention is to provide a semiconductor device having a novel structure in which stored data can be held even when power is not supplied and in which the number of times of writing is not limited.

In the disclosed invention, a semiconductor device is formed using a material which allows a sufficient reduction in off-state current of a transistor; for example, an oxide semiconductor material, which is a wide-gap semiconductor, is used. When a semiconductor material which allows a sufficient reduction in off-state current of a transistor is used, the semiconductor device can hold data for a long time.

One embodiment of the disclosed invention includes at least a memory cell and a potential converter circuit. The memory cell and the potential converter circuit are electrically connected to each other through a signal line. The memory cell has a transistor including an oxide semiconductor.

Specifically, the following structure can be employed, for example.

One embodiment of the present invention is a semiconductor device including a first signal line, a second signal line, a memory cell, and a potential converter circuit. The memory cell includes a first transistor including a first gate electrode, a first source electrode, a first drain electrode, and a first channel formation region; a second transistor including a second gate electrode, a second source electrode, a second drain electrode, and a second channel formation region; and a first capacitor. The first channel formation region and the second channel formation region include different semiconductor materials. The second drain electrode, one electrode of the first capacitor, and the first gate electrode are electrically connected to one another. The second gate electrode is electrically connected to the potential converter circuit through the second signal line. The second source electrode is electrically connected to the first signal line. In the case where a low potential is input to the potential converter circuit, the potential converter circuit outputs the low potential to the second signal line, and in the case where a high potential is input to the potential converter circuit, the potential converter circuit outputs a potential higher than the high potential to the second signal line.

Another embodiment of the present invention is a semiconductor device including a first signal line, a second signal line, a source line, a word line, a bit line, a memory cell, and a potential converter circuit. The memory cell includes a first transistor including a first gate electrode, a first source electrode, a first drain electrode, and a first channel formation region; a second transistor including a second gate electrode, a second source electrode, a second drain electrode, and a second channel formation region; and a first capacitor. The first channel formation region and the second channel formation region include different semiconductor materials. The second drain electrode, one electrode of the first capacitor, and the first gate electrode are electrically connected to one another. The second gate electrode is electrically connected to the potential converter circuit through the second signal line. The second source electrode is electrically connected to the first signal line. The other electrode of the first capacitor is electrically connected to the word line. The first source electrode is electrically connected to the source line. The first drain electrode is electrically connected to the bit line. In the case where a low potential is input to the potential converter circuit, the potential converter circuit outputs the low potential to the second signal line, and in the case where a high potential is input to the potential converter circuit, the potential converter circuit outputs a potential higher than the high potential to the second signal line.

In the above semiconductor device, it is preferable that the first transistor include a semiconductor material other than an oxide semiconductor and the second transistor include an oxide semiconductor material.

In the above semiconductor device, the potential converter circuit includes a first wiring; a second wiring; a third wiring; a third transistor including a third gate electrode, a third source electrode, a third drain electrode, and a third channel formation region; a fourth transistor including a fourth gate electrode, a fourth source electrode, a fourth drain electrode, and a fourth channel formation region; and a second capacitor. The second signal line, one electrode of the second capacitor, and one of the fourth source electrode and the fourth drain electrode are electrically connected to one another. The other electrode of the second capacitor and one of the third source electrode and the third drain electrode are electrically connected to each other. The other of the third source electrode and the third drain electrode and the first wiring are electrically connected to each other. The third gate electrode, the other of the fourth source electrode and the fourth drain electrode, and the second wiring are electrically connected to one another. The fourth gate electrode and the third wiring are electrically connected to each other.

In the above semiconductor device, it is preferable that the third transistor and the fourth transistor each include a semiconductor material other than an oxide semiconductor. Alternatively, in the above semiconductor device, it is preferable that the third transistor and the fourth transistor each include an oxide semiconductor material.

In the above semiconductor device, the potential converter circuit includes a fifth transistor including a fifth gate electrode, a fifth source electrode, a fifth drain electrode, and a fifth channel formation region; and a fourth wiring. One of the fifth source electrode and the fifth drain electrode and the second signal line are electrically connected to each other. The other of the fifth source electrode and the fifth drain electrode is grounded. The fifth gate electrode and the fourth wiring are electrically connected to each other.

In the above structure, the fifth transistor includes a semiconductor material other than an oxide semiconductor. Alternatively, in the above structure, the fifth transistor includes an oxide semiconductor material.

Another embodiment of the present invention is a method for driving a semiconductor device, including the step of selecting an on state or an off state of a second transistor to hold charge in a node where a gate electrode of a first transistor, a source electrode or a drain electrode of the second transistor, and one electrode of a first capacitor are electrically connected to one another. In the case where a high potential is supplied to the node, a potential supplied to a gate electrode of the second transistor to make the second transistor be in the on state is higher than a power supply potential.

In the above method for driving a semiconductor device, the potential to make the second transistor be in the on state is higher than a potential which is obtained by addition of a threshold voltage of the second transistor to the power supply potential.

Note that although the transistor may be formed using an oxide semiconductor in the above description, the disclosed invention is not limited to this. A material with which the off-state current characteristics equivalent to those of the oxide semiconductor can be achieved, such as a wide gap material like silicon carbide (specifically, a semiconductor material whose energy gap Eg is larger than 3 eV) may be used.

Note that in this specification and the like, the term such as "over" or "below" does not necessarily mean that components are in contact with each other. For example, the expression "a gate electrode over a gate insulating layer" does not exclude the case where another component is provided between the gate insulating layer and the gate electrode. Moreover, the terms such as "over" and "below" are only used for convenience of explanation and the positions can be interchanged unless otherwise specified.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" are formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be interchanged in this specification.

Note that in this specification and the like, the term "electrically connected" includes the case where components are connected through an object having any electric function. There is no particular limitation on the object having any electric function as long as electric signals can be transmitted and received between the components connected through the object.

Examples of the object having any electric function include a switching element such as a transistor, a resistor, an inductor, a capacitor, and an element with a variety of functions as well as an electrode and a wiring.

Since the off-state current of a transistor including an oxide semiconductor is extremely small, stored data can be held for an extremely long period by using the transistor. In other words, refresh operation becomes unnecessary or the frequency of the refresh operation can be extremely low, which leads to a sufficient reduction in power consumption. Moreover, stored data can be held for a long period even when power is not supplied (note that a potential is preferably fixed).

Further, a semiconductor device according to the disclosed invention does not need high voltage for writing data, and deterioration of the element does not become a problem. For example, unlike a conventional non-volatile memory, it is not necessary to inject and extract electrons into and from a floating gate, and thus a problem such as deterioration of a gate insulating layer does not occur at all. That is, the semiconductor device according to the disclosed invention does not have a limit on the number of times of rewriting, which has been a problem of a conventional non-volatile memory, and thus has drastically improved reliability. Furthermore, since data is written by turning on or off the transistor, highspeed operation can be easily realized. Additionally, there is an advantage that operation for erasing data is not needed.

Since a transistor including a material other than an oxide semiconductor can operate at sufficiently high speed, when it is combined with a transistor including an oxide semiconductor, a semiconductor device can perform operation (e.g., reading data) at sufficiently high speed. Further, a transistor including a material other than an oxide semiconductor can suitably realize a variety of circuits (e.g., a logic circuit or a driver circuit) which need to operate at high speed.

Thus, a semiconductor device having a novel feature can be realized by being provided with both the transistor including a material other than an oxide semiconductor (a transistor capable of operation at sufficiently high speed, in general) and the transistor including an oxide semiconductor (a transistor whose off-state current is sufficiently small, in general).

In the above semiconductor device, the potential converter circuit electrically connected to the gate of the transistor whose off-state current is sufficiently low is provided, whereby data can be successfully written to the node where the gate electrode of the transistor which can operate at sufficiently high speed, the source electrode or the drain electrode of the transistor whose off-state current is sufficiently low, and one electrode of the capacitor are electrically connected to one another. Therefore, characteristics of the semiconductor device can be further improved.

BRIEF DESCRIPTION OF DRAWINGS

FIG. 2 is a circuit diagram of a semiconductor device.
FIGS. 15A to 15C are circuit diagrams of semiconductor devices.

BEST MODE FOR CARRYING OUT THE INVENTION

Figures 1, 1A:
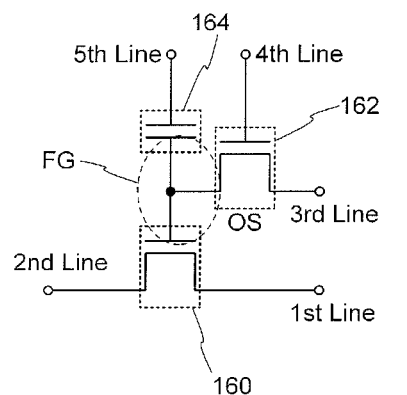
FIGS. 1A-1, 1A-2, and 1B are circuit diagrams of semiconductor devices.

Hereinafter, embodiments and examples of the present invention are described with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments and examples to be given below.

Note that the position, the size, the range, or the like of each structure illustrated in drawings and the like is not accurately represented in some cases for easy understanding. The disclosed invention is thus not necessarily limited by the position, size, range, or the like illustrated in the drawings and the like.

In this specification and the like, ordinal numbers such as first, second, and third are used in order to avoid confusion among components, and the terms do not limit the components numerically.

Embodiment 1

In this embodiment, a basic circuit structure and operation of a semiconductor device according to one embodiment of the disclosed invention will be described with reference to FIGS. 1A-1, 1A-2, and 1B, FIG. 2, FIG. 3, FIG. 4, FIG. 5, and FIG. 6. Note that in each of the circuit diagrams, "OS" may be written beside a transistor in order to indicate that the transistor includes an oxide semiconductor.

<Basic Circuit 1>

First, the most basic circuit structure and its operation will be described with reference to FIGS. 1A-1, 1A-2, and 1B. In the semiconductor device in FIG. 1A-1, a first wiring (a 1st line) and a source electrode (or a drain electrode) of a transistor 160 are electrically connected to each other, and a second wiring (a 2nd line) and the drain electrode (or the source electrode) of the transistor 160 are electrically connected to each other. In addition, a third wiring (a 3rd line) and a source electrode (or a drain electrode) of a transistor 162 are electrically connected to each other, and a fourth wiring (a 4th line) and a gate electrode of the transistor 162 are electrically connected to each other. In addition, a gate electrode of the transistor 160 and the drain electrode (or the source electrode) of the transistor 162 are electrically connected to one electrode of a capacitor 164 (also referred to as a first capacitor), and a fifth wiring (a 5th line) and the other electrode of the capacitor 164 are electrically connected to each other.

Here, a transistor including an oxide semiconductor is used as the transistor 162, for example. Off-state current of a transistor including an oxide semiconductor is extremely small. Therefore, when the transistor 162 is in an off state, a potential in the gate electrode of the transistor 160 can be held for a very long time. The capacitor 164 facilitates holding of charge applied to the gate electrode of the transistor 160 and reading of the held data.

Note that there is no particular limitation on the transistor 160. In order to increase the speed of reading data, it is preferable to use, for example, a transistor with high switching speed, such as a transistor formed using single crystal silicon.

Figure 1B:
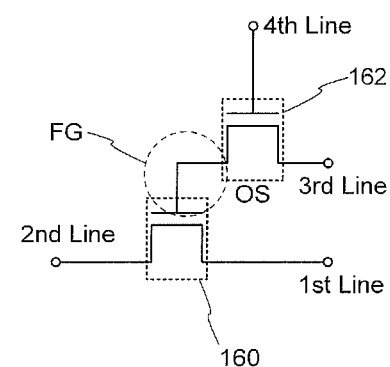

Alternatively, the capacitor 164 may be omitted as in FIG. 1B.

The semiconductor device in FIG. 1A-1 can write, hold, and read data as described below, utilizing a characteristic in which the potential of the gate electrode of the transistor 160 can be held.

Firstly, writing and holding of data will be described. The potential of the fourth wiring is set to a potential at which the transistor 162 is turned on, whereby the transistor 162 is turned on. Thus, the potential of the third wiring is applied to the gate electrode of the transistor 160 and the capacitor 164. That is, predetermined charge is applied to the gate electrode of the transistor 160 (writing of data). Here, charge for applying either two different levels of potential (hereinafter charge for applying a low potential is referred to as charge $Q_L$ and charge for applying a high potential is referred to as charge $Q_H$) is applied. Note that charge for applying three or more different levels of potential may be employed to improve storage capacity. After that, the potential of the fourth wiring is set to a potential at which the transistor 162 is turned off, whereby the transistor 162 is turned off. Thus, the charge applied to the gate electrode of the transistor 160 is held (holding of data).

Since the off-state current of the transistor 162 is extremely small, the charge in the gate electrode of the transistor 160 is held for a long period.

Secondly, reading of data will be described. While a predetermined potential (a fixed potential) is applied to the first wiring, an appropriate potential (a read-out potential) is applied to the fifth wiring, whereby the potential of the second wiring changes depending on the amount of charge held in the gate electrode of the transistor 160. This is because in general, when the transistor 160 is an n-channel transistor, an apparent threshold value $V_{th\_H}$ in the case where $Q_H$ is held in the gate electrode of the transistor 160 is lower than an apparent threshold value $V_{th\_L}$ in the case where $Q_L$ is held in the gate electrode of the transistor 160. Here, an apparent threshold value refers to the potential of the fifth wiring which is needed to turn on the transistor 160. Thus, by setting the potential of the fifth wiring to a potential $V_0$ which is between $V_{th\_H}$ and $V_{th\_L}$, charge held in the gate electrode of the transistor 160 can be determined. For example, in the case where $Q_H$ is applied in writing, when the potential of the fifth wiring is set to $V_0$ ($>V_{th\_H}$), the transistor 160 is turned on. In the case where $Q_L$ is applied in writing, even when the potential of the fifth wiring is set to $V_0$ ($V_{th\_L}$), the transistor 160 remains off. Thus, the data held can be read by measuring the potential of the second wiring.

Note that in the case where memory cells are arrayed, it is necessary to read out data only from an intended memory cell. In the case where data of predetermined memory cell is read out and data of the other memory cells is not read out, a potential at which the transistor 160 is in an off state regardless of the state of the gate electrode, that is, a potential lower than $V_{th\_H}$, may be applied to the fifth wirings of the memory cells whose data is not to be read. Alternatively, a potential at which the transistor 160 is in an on state regardless of the state of the gate electrode, that is, a potential higher than $V_{th\_L}$, may be applied to the fifth wirings of the memory cells whose data is not to be read.

Thirdly, rewriting of data will be described. Rewriting of data is performed in a manner similar to that of the writing and holding of data. In other words, the potential of the fourth wiring is set to a potential at which the transistor 162 is turned on, whereby the transistor 162 is turned on. Accordingly, the potential of the third wiring (a potential for new data) is applied to the gate electrode of the transistor 160 and the capacitor 164. After that, the potential of the fourth wiring is set to a potential at which the transistor 162 is turned off, whereby the transistor 162 is turned off. Thus, charge for the new data is applied to the gate electrode of the transistor 160.

In the semiconductor device according to the disclosed invention, data can be directly rewritten by another writing of data as described above. Therefore, extracting of charge from a floating gate with the use of high voltage, which is needed in a flash memory or the like, is not needed and thus a reduction in operation speed caused by erasing operation can be suppressed. In other words, high-speed operation of the semiconductor device can be realized.

Note that the source electrode or the drain electrode of the transistor 162 is electrically connected to the gate electrode of the transistor 160, and thereby has an effect similar to that of a floating gate of a floating-gate transistor which is used as a non-volatile memory element. In drawings, the portion where the source electrode or the drain electrode of the transistor 162 and the gate electrode of the transistor 160 are electrically connected to each other is called a floating gate portion FG in some cases. When the transistor 162 is off, the floating gate portion FG can be regarded as being embedded in an insulator and charge is held in the floating gate portion FG. The off-state current of the transistor 162 including an oxide semiconductor is smaller than or equal to one hundred thousandth of the off-state current of a transistor including a silicon semiconductor or the like; thus, loss of the charge accumulated in the floating gate portion FG due to leakage current of the transistor 162 is negligible. That is, with the transistor 162 including an oxide semiconductor, a non-volatile memory device which can hold data without power supply can be realized.

For example, when the off-state current of the transistor 162 is smaller than or equal to 10 zA (1 zA (zeptoampere) is $1\times10^{-21}$ A) at room temperature (25° C.) and the capacitance value of the capacitor 164 is approximately 10 fF, data can be held for $10^4$ seconds or longer. It should be appreciated that the holding time changes depending on the transistor characteristics and the capacitance value.

In this case, a problem of deterioration of a gate insulating film (a tunnel insulating film), which occurs in a conventional floating-gate transistor, does not exist. That is, deterioration of a gate insulating film due to injection of electrons into a floating gate, which has been regarded as a problem, can be solved. This means that there is no limitation on the number of times of writing in principle. In addition, high voltage which is needed for writing or erasing data in a conventional floating-gate transistor is not necessary.

Figures 1, 1A, 2:
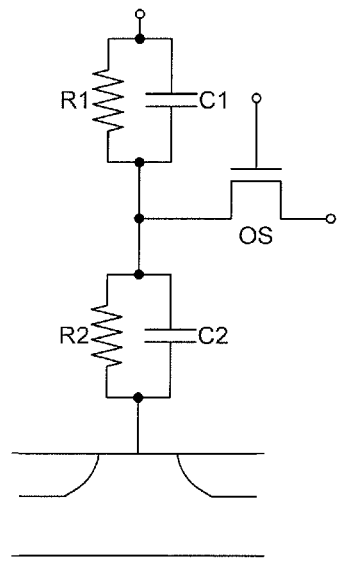
Figure 2:
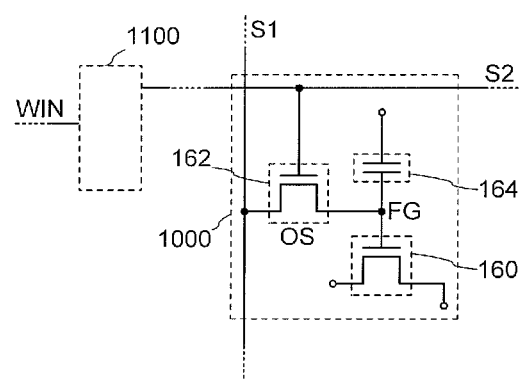

The components such as transistors in the semiconductor device in FIG. 1A-1 can be regarded as including a resistor and a capacitor as shown in FIG. 1A-2. That is, in FIG. 1A-2, the transistor 160 and the capacitor 164 are each regarded as including a resistor and a capacitor. R1 and C1 denote the resistance value and the capacitance value of the capacitor 164, respectively. The resistance value R1 corresponds to the resistance value of an insulating layer included in the capacitor 164. R2 and C2 denote a resistance value and a capacitance value of the transistor 160, respectively. The resistance value R2 corresponds to the resistance value of a gate insulating layer at the time when the transistor 160 is on. The capacitance value C2 corresponds to the capacitance value of so-called gate capacitance (capacitance between the gate electrode and the source electrode or drain electrode and capacitance between the gate electrode and the channel formation region).

A charge holding period (also referred to as a data holding period) is determined mainly by off-state current of the transistor 162 under the condition where gate leakage of the transistor 162 is sufficiently small and R1 and R2 satisfy R1≧ROS and R2≧ROS, where ROS is the resistance value (also referred to as effective resistance) between the source electrode and the drain electrode at the time when the transistor 162 is off.

On the other hand, when the condition is not satisfied, it would be difficult to ensure a sufficient holding period even if the off-state current of the transistor 162 is small enough. This is because leakage current other than the off-state current of the transistor 162 (e.g., leakage current generated between the source electrode and the gate electrode) would be large. Thus, it can be said that the semiconductor device disclosed in this embodiment desirably satisfies the above relation.

It is desirable that C1 and C2 satisfy C1≧C2. This is because by increasing C1, the potential of the fifth wiring can be effectively applied to the floating gate portion FG when the potential in the floating gate portion FG is controlled by the fifth wiring, and thus the difference between the potentials applied to the fifth wiring (e.g., a potential of reading and a potential of not reading) can be reduced.

As described above, when the above relation is satisfied, a more favorable semiconductor device can be realized. Note that R1 and R2 are determined by the gate insulating layer included in the transistor 160 and an insulating layer included in the capacitor 164, respectively. Similarly, C1 and C2 are determined by the gate insulating layer of the transistor 160 and the insulating layer included in the capacitor 164, respectively. Therefore, the material, the thickness, and the like of the gate insulating layer are desirably set as appropriate so that the above relation may be satisfied.

In the semiconductor device described in this embodiment, the floating gate portion FG has an effect similar to a floating gate of a floating-gate transistor in a flash memory or the like, but the floating gate portion FG of this embodiment has a feature which is essentially different from that of the floating gate in the flash memory or the like.

In a flash memory, since a voltage applied to a control gate is high, it is necessary to keep a proper distance between cells in order to prevent the potential from affecting a floating gate of the adjacent cell. This is one of the factors inhibiting high integration of the semiconductor device. The factor is due to a basic principle of a flash memory that tunneling current is generated by application of a high electric field.

In contrast, the semiconductor device according to this embodiment is operated by switching of a transistor including an oxide semiconductor and does not use the above principle of charge injection by tunneling current. That is, unlike a flash memory, a high electric field for charge injection is not necessary. Accordingly, an effect of a high electric field for a control gate on an adjacent cell does not need to be taken into account, and thus high integration can be facilitated.

In addition, it is also advantage over a flash memory that a high electric field is unnecessary and a large peripheral circuit (such as a booster circuit) is unnecessary. For example, the maximum value of voltage applied to the memory cell according to this embodiment (the difference between the highest potential and the lowest potential applied to terminals of the memory cell at the same time) can be 5 V or lower, preferably 3 V or lower, in each memory cell in the case where two-level (one-bit) data is written.

In the case where the dielectric constant ϵr1 of the insulating layer included in the capacitor 164 is different from the dielectric constant ϵr2 of the insulating layer included in the transistor 160, C1 and C2 can easily satisfy C1≧C2 while S1 which is the area of the insulating layer included in the capacitor 164 and S2 which is the area of an insulating layer forming gate capacitance of the transistor 160 satisfy 2×S2≧S1 (desirably S2≧S1). In other words, C1≧C2 can be easily satisfied while the area of the insulating layer included in the capacitor 164 is small. Specifically, for example, when a film formed of a high-k material such as hafnium oxide or a stack of a film formed of a high-k material such as hafnium oxide and a film formed of an oxide semiconductor is used for the insulating layer included in the capacitor 164, ϵr1 can be set to 10 or more, preferably 15 or more, and when a film formed of silicon oxide is used for the insulating layer forming the gate capacitance, ϵr2 can be set to 3 to 4.

Combination of such structures enables higher integration of the semiconductor device according to the disclosed invention.

Note that in addition to the increase in the degree of integration, a multilevel technique can be employed in order to increase the storage capacity of the semiconductor device. For example, three or more levels of data are written to one memory cell, whereby the storage capacity can be increased as compared to that in the case where two-level (one-bit) data is written. The multilevel technique can be achieved by, for example, giving charge Q to the gate electrode of the first transistor, in addition to charge $Q_L$ for supplying a low potential and charge $Q_H$ for supplying a high potential. In this case, enough storage capacity can be ensured even in a circuit structure with a relatively large scale (e.g., 15 $F^2$ to 50 $F^2$; F is the minimum feature size).

Note that an n-channel transistor (an n-type transistor) in which electrons are majority carriers is used in the above description, but it will be appreciated that a p-channel transistor in which holes are majority carriers can be used instead of the n-channel transistor.

<Basic Circuit 2>

Next, a circuit configuration and operation of a semiconductor device in which data can be written successfully will be described with reference to FIG. 2.

The semiconductor device illustrated in FIG. 2 includes at least a memory cell 1000 and a potential converter circuit 1100. Here, the structure of the memory cell 1000 is similar to that of the semiconductor device illustrated in FIG. 1A-1. That is, in the memory cell 1000, the transistor 162 including an oxide semiconductor is formed. In other words, the semiconductor device illustrated in FIG. 2 can be regarded as a modified example of the semiconductor device illustrated in FIG. 1A-1.

Note that a first signal line S1 in FIG. 2 corresponds to the third wiring in FIG. 1A-1, and a second signal line S2 in FIG. 2 corresponds to the fourth wiring in FIG. 1A-1. Here, the circuit configuration including one memory cell 1000 is described for simplicity; however, it is needless to say that the circuit configuration may include a plurality of memory cells (for example, memory cells arranged in m rows and n columns=(m×n) memory cells).

A wiring WIN which transmits a signal for selecting the memory cell 1000 to which data is to be written is connected to the potential converter circuit 1100. As a potential supplied to the wiring WIN, a power supply potential VDD, a reference potential GND, or the like is given, for example. Moreover, the second signal line S2 is connected to the potential converter circuit 1100. The potential converter circuit 1100 supplies the second signal line S2 with a potential in accordance with the potential of the wiring WIN.

Here, the case where a high potential VS1*h* (e.g., the power supply potential VDD) is supplied to the first signal line S1, a high potential VS2*h* is supplied to the second signal line S2 to turn on the transistor 162, and a potential VFGh is supplied to a floating gate portion FG is described. In general, the power supply potential VDD is given as a high potential used for a semiconductor device. However, when the power supply potential VDD is used as it is as the high potential VS1*h* or the high potential VS2*h*, a potential supplied to the floating gate portion FG corresponds to a value represented as VDD-Vth (Vth is a threshold voltage of the transistor 162) which is lower than the power supply potential VDD. This is because the higher the potential of the floating gate portion FG is, the smaller a potential difference between the gate and the source (or the drain) becomes, and the transistor 162 is turned off when the potential difference becomes equal to the threshold voltage of the transistor 162.

In the case where the potential of the floating gate portion FG cannot be sufficiently increased as described above, a problem arises in that the data holding time is shortened. Thus, in the case where the potential VFGh is supplied to the floating gate portion FG, a potential sufficiently higher than the high potential VS1h which is supplied to the first signal line S1 is supplied to the second signal line S2 by the potential converter circuit 1100. With such a structure, a potential substantially equal to the high potential VS1h supplied to the first signal line S1 can be supplied to the floating gate portion FG. Here, the "sufficiently high potential" that is supplied to the second signal line S2 is higher than the high potential VS1h by the threshold voltage Vth of the transistor 162. That is, VS2h which satisfies VS2h≧VS1h+Vth may be supplied to the second signal line S2.

On the other hand, the above problem does not arise in the case where a low potential VFG1 (e.g., the reference potential GND) is supplied to the floating gate portion FG; thus, a potential input from the wiring WIN may be output to the second signal line S2 without any change.

That is, the potential converter circuit 1100 is a circuit having at least the following functions.

In the case where a potential input from the wiring WIN is a low potential (e.g., the reference potential GND), the potential converter circuit 1100 outputs the low potential to the second signal line S2.

In the case where a potential input from the wiring WIN is a high potential (e.g., the power supply potential VDD), the potential converter circuit 1100 outputs a potential higher than the high potential to the second signal line S2.

When the semiconductor device is provided with the potential converter circuit 1100 having such functions, data can be successfully written to the floating gate portion FG; thus, characteristics of the semiconductor device can be further improved.

Note that in FIG. 2, one potential converter circuit 1100 is provided because one memory cell 1000 is provided; however, in the case where memory cells are arranged in matrix, one potential converter circuit is preferably provided for each row (or each column when the arrangement of the second signal lines S2 is changed).

Specific Example

Next, a specific example of the potential converter circuit 1100 and operation of a semiconductor device using that will be described with reference to FIG. 3 and FIG. 4.

Figure 3:
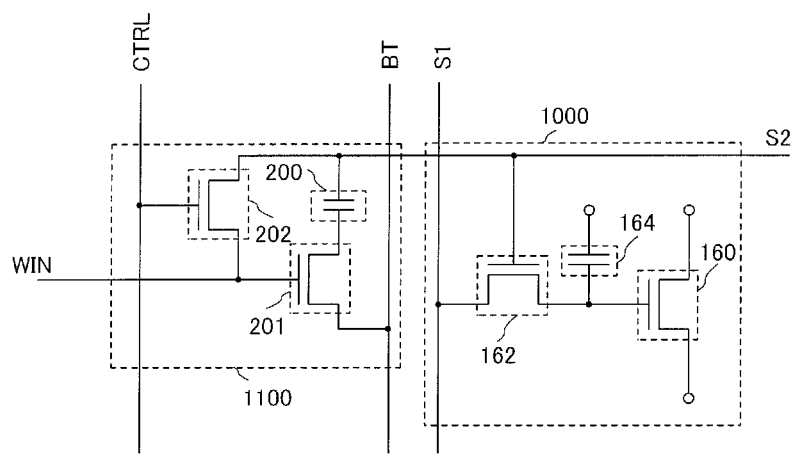
FIG. 3 is a circuit diagram of a semiconductor device.

FIG. 3 illustrates an example of the potential converter circuit 1100 and the memory cell 1000. The potential converter circuit 1100 and the memory cell 1000 are connected to each other through the second signal line S2. Here, as a memory cell, the memory cell 1000 in FIG. 2 can be used.

The potential converter circuit 1100 includes a first wiring BT, a second wiring WIN, a third wiring CTRL, a transistor 201, a transistor 202, and a capacitor 200 (also referred to as a second capacitor).

Here, the second signal line S2, one electrode of the capacitor 200, and a source electrode (or a drain electrode) of the transistor 202 are electrically connected to one another. The other electrode of the capacitor 200 and a source electrode (or a drain electrode) of the transistor 201 are electrically connected to each other. The drain electrode (or the source electrode) of the transistor 201 and the first wiring BT are electrically connected to each other. A gate electrode of the transistor 201, the drain electrode (or the source electrode) of the transistor 202, and the second wiring WIN are electrically connected to one another. A gate electrode of the transistor 202 and the third wiring CTRL are electrically connected to each other.

With the use of the potential converter circuit 1100 having the above structure, the potential of the second signal line S2 can be increased. The operation of the potential converter circuit 1100 is described below with reference to a timing chart of FIG. 4. Note that the potential converter circuit 1100 operates when data is written to the memory cell, and therefore only the operation at the time of writing data to the memory cell is described. Further, the case where the floating gate portion FG is supplied with VDD is described below. In the following description, a high potential is the power supply potential VDD, a low potential is the reference potential GND, the threshold voltage of the transistor 201 is VTH1, the threshold voltage of the transistor 202 is VTH2, and the threshold voltage of the transistor 162 is VTH3.

Figure 4:
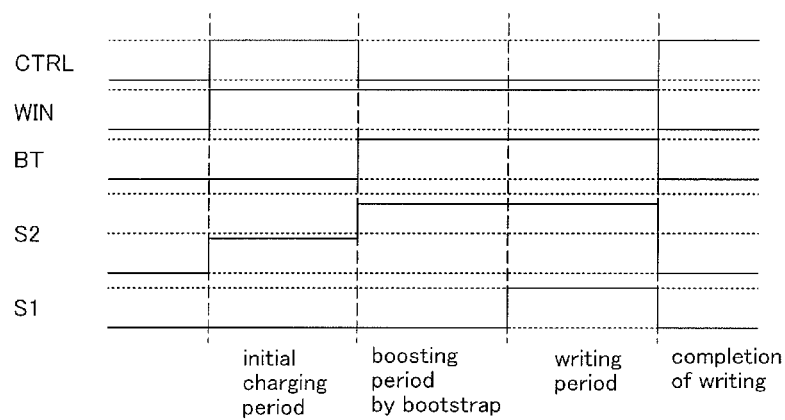
FIG. 4 is a timing chart.

In FIG. 4, CTRL denotes a potential of the third wiring CTRL, WIN denotes a potential of the second wiring WIN, BT denotes a potential of the first wiring BT, S2 denotes a potential of the second signal line S2, and S1 denotes a potential of the first signal line S1.

In an initial charging period, CTRL is supplied with VDD so that the transistor 202 is brought into an on state. Accordingly, the second wiring WIN and the second signal line S2 are connected to each other. That is, the second signal line S2 is supplied with a potential in accordance with the potential of the second wiring WIN. Since the potential of the second wiring WIN is VDD, the potential of the second signal line S2 becomes VDD−VTH2 due to a voltage drop in the transistor 202. Note that at this timing, the potential of the first wiring BT and the potential of the first signal line S1 are GND.

After that, when the potential of CTRL is GND, the transistor 202 is brought into an off state and the second signal line S2 is brought into a floating state. At this timing, when the second wiring WIN is supplied with VDD and the first wiring BT is supplied with VDD, the potential of a node where the other electrode of the capacitor 200 and the source electrode (or the drain electrode) of the transistor 201 are connected to each other becomes VDD−VTH1 due to a voltage drop in the transistor 201. That is, the potential of the node is increased from GND to VDD−VTH1.

The node and the second signal line S2 are capacitively coupled by the capacitor 200; thus, since the potential of the node is increased by VDD−VTH1, the potential of the second signal line is also increased by VDD−VTH1. Accordingly, the potential of the second signal line becomes VDD−VTH1+ VDD−VTH2=2×VDD−(VTH1+VTH2).

The first signal line S1 is supplied with VDD after the potential of the second signal line S2 reaches 2×VDD− (VTH1+VTH2), whereby the floating gate portion FG in the memory cell 1000 can be supplied with VDD (see a writing period in the drawing). It needs to be noted that the condition where 2×VDD−(VTH1+VTH2) which is the potential of the second signal line S2 is larger than at least VDD+VTH3 should be satisfied. Note that the condition is for the case where the capacitance of the memory cell (specifically, the transistor 162) connected to the second signal line S2 (if a plurality of memory cells are connected to the second signal line S2, the total amount of the capacitance of the plurality of memory cells) is sufficiently smaller than the capacitance of the capacitor 200 in the potential converter circuit 1100.

In the case where the capacitance of the memory cell is not a negligible amount relative to the capacitance of the capacitor 200, a potential supplied to the second signal line S2 becomes $C_{200}/(C_{all}+C_{200})$ of $(2\times VDD-(VTH1+VTH2))$ when the total capacitance of the memory cell is $C_{all}$ and the capacitance of the capacitor 200 is $C_{200}$. That is, the potential supplied to the second signal line S2 becomes $(C_{200}/(C_{all}+C_{200}))\times(2\times VDD-(VTH1+VTH2))$. Therefore, in this case, the above potential should be larger than at least VDD+VTH3.

After the writing period is finished, the potential of WIN is set to GND, the potential of CTRL is set to VDD, and the potential of the second signal line S2 is set to GND (see completion of writing in the drawing).

Note that in the case where GND is supplied to the floating gate portion FG in the memory cell, GND is supplied to the second signal line S2 without the above bootstrap operation.

Next, another specific example of the potential converter circuit 1100 and operation of a semiconductor device using that will be described with reference to FIG. 5 and FIG. 6.

Figure 5:
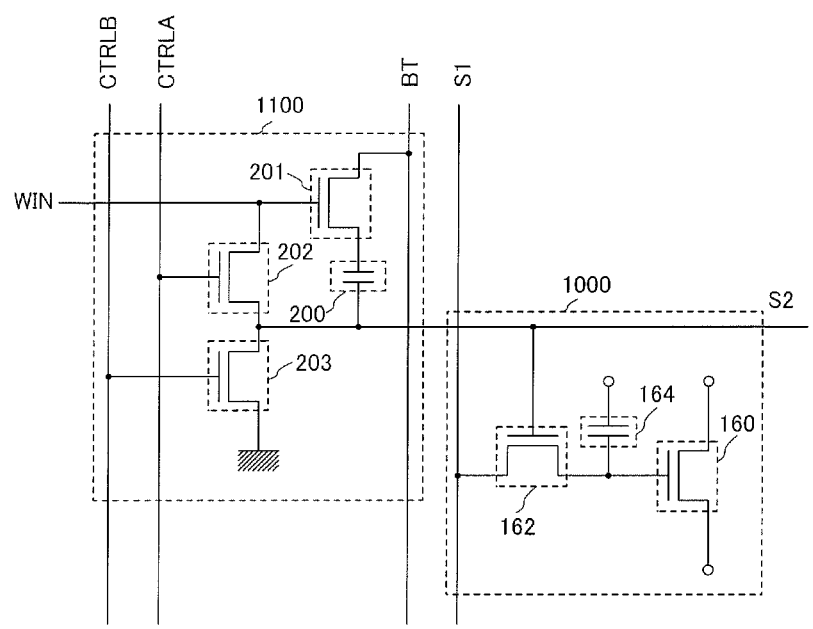
FIG. 5 is a circuit diagram of a semiconductor device.

FIG. 5 is another example of the structure of the potential converter circuit 1100. The potential converter circuit 1100 and the memory cell 1000 are connected to each other through the second signal line S2. Here, as a memory cell, the memory cell 1000 in FIG. 2 can be used.

The potential converter circuit 1100 in FIG. 5 includes the first wiring BT, the second wiring WIN, a third wiring CTRLA, a fourth wiring CTRLB, the transistor 201, the transistor 202, a transistor 203, and the capacitor 200. That is, the potential converter circuit 1100 in FIG. 5 has a structure in which the potential converter circuit 1100 in FIG. 3 is provided with the transistor 203 and the fourth wiring CTRLB. Note that the third wiring CTRLA in FIG. 5 corresponds to the third wiring CTRL in FIG. 3.

Here, the second signal line S2, one electrode of the capacitor 200, the source electrode (or the drain electrode) of the transistor 202, and a drain electrode (or a source electrode) of the transistor 203 are electrically connected to one another. The other electrode of the capacitor 200 and the source electrode (or the drain electrode) of the transistor 201 are electrically connected to each other. The drain electrode (or the source electrode) of the transistor 201 and the first wiring BT are electrically connected to each other. The gate electrode of the transistor 201, the drain electrode (or the source electrode) of the transistor 202, and the second wiring WIN are electrically connected to one another. The gate electrode of the transistor 202 and the third wiring CTRLA are electrically connected to each other. A gate electrode of the transistor 203 and the fourth wiring CTRLB are electrically connected to each other. The source electrode (or the drain electrode) of the transistor 203 is grounded.

With the use of the potential converter circuit 1100 having the above structure, the potential of the second signal line S2 can be increased. The operation of the potential converter circuit 1100 is described below with reference to a timing chart of FIG. 6.

Figure 6:
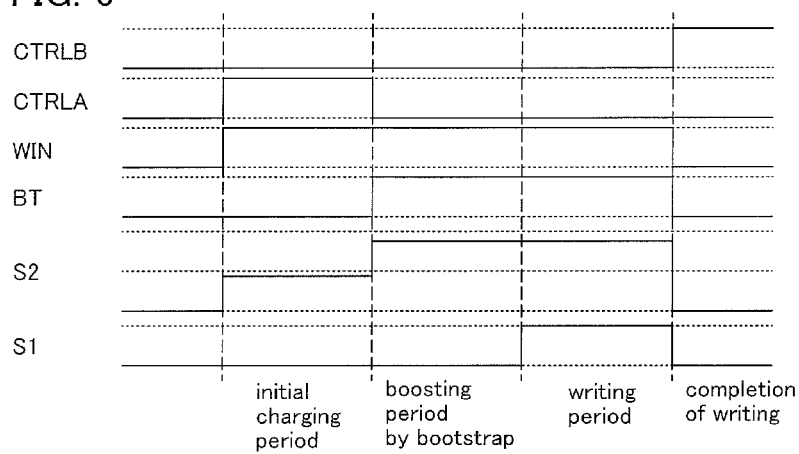
FIG. 6 is a timing chart.

In FIG. 6, CTRLA denotes a potential of the third wiring CTRLA, CTRLB denotes a potential of the fourth wiring CTRLB, WIN denotes a potential of the second wiring WIN, BT denotes a potential of the first wiring BT, S2 denotes a potential of the second signal line S2, and S1 denotes a potential of the first signal line S1.

As shown in FIG. 6, the operation of the potential converter circuit 1100 is similar to that in the timing chart of FIG. 4 up to the writing period; thus, the detailed description thereof is omitted. Note that a change in potential of CTRLA in FIG. 6 is similar to a change in potential of CTRL in FIG. 4. Note that the potential of CTRLB is 0 V until the writing period is finished.

After the writing period is finished, the potential of CTRLB is set to VDD, and the potential of the second signal line S2 is set to GND (see completion of writing in the drawing). Note that although the potential of WIN is set to GND here, the potential of WIN is not particularly limited in the case where the potential of CTRLA is set to GND.

Note that in the case where GND is supplied to the floating gate portion FG in the memory cell, GND is supplied to the second signal line S2 without the above bootstrap operation.

When the semiconductor device is provided with the potential converter circuit 1100 having such functions, data can be successfully written to the floating gate portion FG; thus, characteristics of the semiconductor device can be further improved.

Note that in FIG. 5, there in no particular limitation on semiconductor materials used for the transistors 201, 202, and 203. Note that in the case where a semiconductor material which allows sufficient reduction in off-state current of the transistor such as an oxide semiconductor material is used, bootstrap operation can be successfully performed; thus, such a semiconductor material is preferably used. In particular, the transistor 202 and the transistor 203 are preferably formed using a semiconductor material which allows sufficient reduction in off-state current of the transistor in order to hold the increased potential of the second signal line S2.

Note that the capability of the potential converter circuit 1100 in converting potentials depends on the capacitance of the capacitor 200 included in the potential converter circuit 1100; thus, the capacitance of the capacitor 200 is desirably determined so that the second signal line S2 can be supplied with a required potential. Specifically, the capacitance of the capacitor 200 in the potential converter circuit 1100 is made to be one or more times, preferably five times, as high as the total capacitance of the memory cells connected to the second signal line S2 (that is, the total value of the capacitance of the transistors 162 connected to the second signal line S2), for example. When the capacitor 200 satisfies such a condition, the second signal line S2 can be easily supplied with a potential higher than VDD+VTH3.

The structures, methods, and the like described in this embodiment can be combined as appropriate with any of the structures, methods, and the like described in the other embodiments.

Embodiment 2

In this embodiment, a structure and a manufacturing method of a semiconductor device according to one embodiment of the disclosed invention will be described with reference to FIGS. 7A and 7B, FIGS. 8A to 8D, FIGS. 9A to 9C, FIGS. 10A to 10D, and FIGS. 11A to 11C.

<Cross-Sectional Structure and Planar Structure of Semiconductor Device>

Figure 7A:
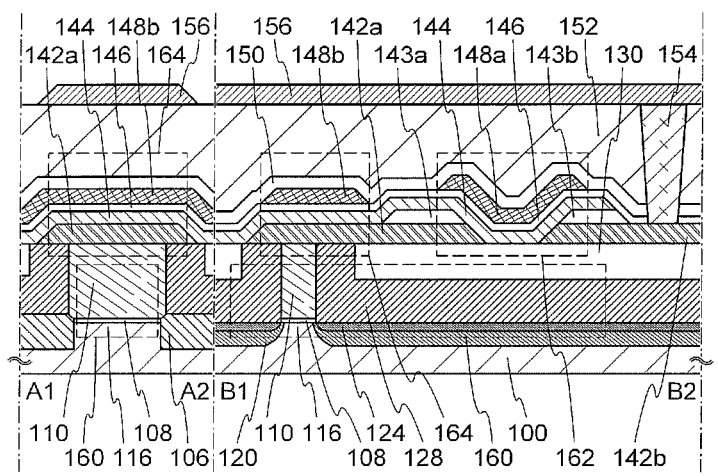
FIGS. 7A and 7B are a cross-sectional view and a plan view of a semiconductor device.
Figure 7B:
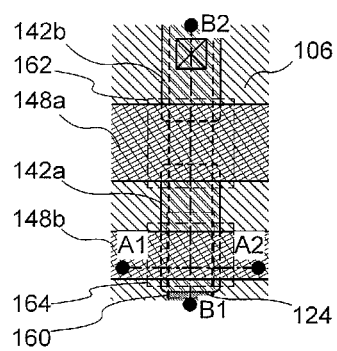

FIGS. 7A and 7B illustrate an example of a structure of a semiconductor device. FIG. 7A illustrates a cross section of the semiconductor device, and FIG. 7B illustrates a plan view of the semiconductor device. Here, FIG. 7A illustrates a cross section taken along lines A1-A2 and B1-B2 in FIG. 7B. The semiconductor device illustrated in FIGS. 7A and 7B includes the transistor 160 including a first semiconductor material in a lower portion, and the transistor 162 including a second semiconductor material in an upper portion. Here, the first semiconductor material and the second semiconductor material are preferably different from each other. For example, the first semiconductor material may be a semiconductor material other than an oxide semiconductor (e.g., silicon) and the second semiconductor material may be an oxide semiconductor. A transistor including a material other than an oxide semiconductor can easily operate at high speed. On the other hand, a transistor including an oxide semiconductor can hold charge for a long time because of its characteristics.

Although both of the transistors are n-channel transistors in this description, it should be appreciated that p-channel transistors can be used. Since the technical feature of the disclosed invention is to use a semiconductor material like an oxide semiconductor, which can sufficiently reduce off-state current, for the transistor 162 in order to hold data, it is not necessary to limit specific conditions such as a structure, a material, and the like of the semiconductor device to those given here.

The transistor 160 in FIGS. 7A and 7B includes a channel formation region 116 provided in a substrate 100 including a semiconductor material (e.g., silicon), impurity regions 120 provided so as to sandwich the channel formation region 116, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of connection of a transistor, a source region and a source electrode may be collectively referred to as a source electrode and a drain region and a drain electrode may be collectively referred to as a drain electrode. That is, in this specification, the term "source electrode" may include a source region and the term "drain electrode" may include a drain region.

Further, the substrate 100 is provided with an element isolation insulating layer 106 which surrounds the transistor 160. An insulating layer 128 and an insulating layer 130 are provided so as to cover the transistor 160. Note that for high integration, it is preferable that, as in FIGS. 7A and 7B, the transistor 160 does not have a sidewall insulating layer. On the other hand, when the characteristics of the transistor 160 have priority, the sidewall insulating layer may be formed on a side surface of the gate electrode 110 and the impurity region 120 may include a region having a different impurity concentration.

The transistor 162 in FIGS. 7A and 7B includes a source or drain electrode 142a and a source or drain electrode 142b which are provided over the insulating layer 130; an oxide semiconductor layer 144 which is electrically connected to the source or drain electrode 142a and the source or drain electrode 142b; a gate insulating layer 146 which covers the source or drain electrode 142a, the source or drain electrode 142b, and the oxide semiconductor layer 144; a gate electrode 148a which is provided over the gate insulating layer 146 so as to overlap with the oxide semiconductor layer 144; an insulating layer 143a provided in a region that overlaps with the gate electrode 148a and is between the source or drain electrode 142a and the oxide semiconductor layer 144; and an insulating layer 143b provided in a region that overlaps with the gate electrode 148a and is between the source or drain electrode 142b and the oxide semiconductor layer 144. Note that the insulating layer 143a and the insulating layer 143b are preferably provided in order to reduce the capacitance between the source or drain electrode and the gate electrode, but they may be omitted.

Here, it is preferable that the oxide semiconductor layer 144 be highly purified by sufficient removal of impurities such as hydrogen or sufficient supply of oxygen. Specifically, the hydrogen concentration in the oxide semiconductor layer 144 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$, for example. Note that the hydrogen concentration in the oxide semiconductor layer 144 is measured by secondary ion mass spectroscopy (SIMS). Thus, in the oxide semiconductor layer 144 in which the hydrogen concentration is sufficiently reduced so that the oxide semiconductor layer is highly purified and in which defect levels in the energy gap due to oxygen deficiency are reduced by sufficient supply of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer (μm) of channel width) at room temperature (25° C.) is 100 zA (1 zA (zeptoampere) is $1\times10^{-21}$ A) or less, preferably 10 zA or less. With the use of such an i-type (intrinsic) or substantially i-type oxide semiconductor, the transistor 162 which has significantly excellent off-state current characteristics can be obtained.

Note that although the transistor 162 in FIGS. 7A and 7B includes the oxide semiconductor layer 144 which is processed into an island shape in order to suppress leakage current between elements which is caused due to miniaturization, the semiconductor layer 144 which is not processed into an island shape may be employed. In the case where the oxide semiconductor layer is not processed into an island shape, contamination of the oxide semiconductor layer 144 due to etching in the process can be prevented.

The capacitor 164 in FIGS. 7A and 7B includes the source or drain electrode 142a, the oxide semiconductor layer 144, the gate insulating layer 146, and an electrode 148b. The source or drain electrode 142a serves as one electrode of the capacitor 164, and the electrode 148b serves as the other electrode of the capacitor 164.

Note that in the capacitor 164 in FIGS. 7A and 7B, the oxide semiconductor layer 144 and the gate insulating layer 146 are stacked, whereby insulation between the source or drain electrode 142a and the electrode 148b can be adequately ensured. Needless to say, in order to provide sufficient capacitance, the oxide semiconductor layer 144 in the capacitor 164 may be omitted. Alternatively, an insulating layer formed in the same manner as the insulating layer 143a may be included in the capacitor 164. Further alternatively, the capacitor 164 may be omitted if not necessary.

Note that in the transistor 162 and the capacitor 164, end portions of the source or drain electrode 142a and the source or drain electrode 142b are preferably tapered. When the end portions of the source or drain electrode 142a and the source or drain electrode 142b are tapered, the coverage with the oxide semiconductor layer 144 can be improved and a breaking thereof can be prevented. Here, the taper angle is greater than or equal to 30° and less than or equal to 60°, for example. Note that the taper angle is a tilt angle formed between a side surface and a bottom surface of a layer having a tapered shape (e.g., the source or drain electrode 142a).

In this embodiment, the transistor 162 and the capacitor 164 are provided so as to overlap with the transistor 160. By employing such a planar layout, high integration is possible. For example, when F is used to express the minimum feature size, the area of a memory cell can be expressed as 15 F$^2$ to 25 F$^2$.

An insulating layer 150 is provided over the transistor 162 and the capacitor 164, and an insulating layer 152 is provided over the insulating layer 150. In an opening formed in the gate insulating layer 146, the insulating layer 150, and the insulating layer 152, an electrode 154 is provided. Over the insulating layer 152, a wiring 156 connected to the electrode 154 is formed. Note that although the source or drain electrode 142b and the wiring 156 are connected to each other through the electrode 154 in FIGS. 7A and 7B, the disclosed invention is not limited thereto. For example, the source or drain electrode 142b may be in direct contact with the metal compound region 124, or the wiring 156 may be in direct contact with the source or drain electrode 142b.

<Method for Manufacturing Semiconductor Device>

Next, an example of a method for manufacturing the semiconductor device will be described. First, a method for manufacturing the transistor 160 in the lower portion will be described below with reference to FIGS. 8A to 8D and FIGS. 9A to 9C, and then a method for manufacturing the transistor 162 and the capacitor 164 in the upper portion will be described with reference to FIGS. 10A to 10D and FIGS. 11A to 11C.

<Method for Manufacturing Transistor in Lower Portion>

Figure 8A:
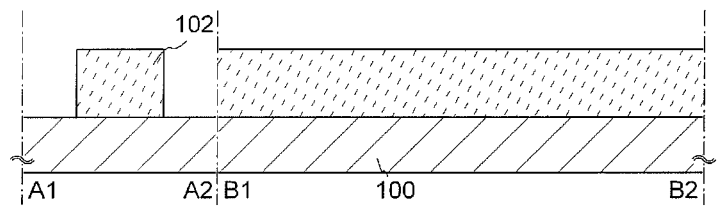
FIGS. 8A to 8D are cross-sectional views illustrating manufacturing steps of a semiconductor device.
Figure 8B:
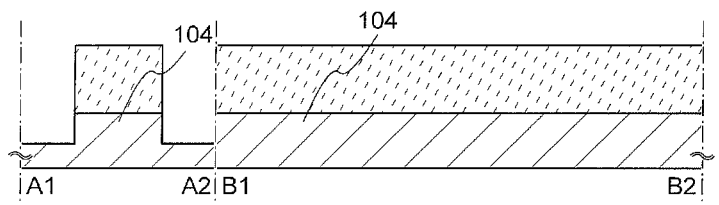

First, the substrate 100 including a semiconductor material is prepared (see FIG. 8A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example where a single crystal silicon substrate is used as the substrate 100 including a semiconductor material is described. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, the semiconductor layer included in the "SOI substrate" is not limited to a silicon semiconductor layer. Moreover, the SOI substrate also includes a substrate having a structure in which a semiconductor layer is provided over an insulating substrate such as a glass substrate with an insulating layer positioned therebetween.

As the substrate 100 including a semiconductor material, a single crystal semiconductor substrate of silicon or the like is particularly preferable because high-speed reading operation of the semiconductor device can be realized.

A protective layer 102 serving as a mask for forming an element isolation insulating layer is formed over the substrate 100 (see FIG. 8A). As the protective layer 102, an insulating layer formed using a material such as silicon oxide, silicon nitride, or silicon oxynitride can be used, for example. Note that before or after this step, an impurity element imparting n-type conductivity or p-type conductivity may be added to the substrate 100 in order to control the threshold voltage of the transistor. When the semiconductor material in the substrate 100 is silicon, phosphorus, arsenic, or the like can be used as the impurity element imparting n-type conductivity, and boron, aluminum, gallium, or the like can be used as the impurity element imparting p-type conductivity.

Then, part of the substrate 100 in a region that is not covered with the protective layer 102 (in an exposed region) is removed by etching using the protective layer 102 as a mask. Thus, a semiconductor region 104 isolated from the other semiconductor regions is formed (see FIG. 8B). As the etching, dry etching is preferably performed, but wet etching may be performed. An etching gas and an etchant can be selected as appropriate in accordance with a material to be etched.

Figure 8C:
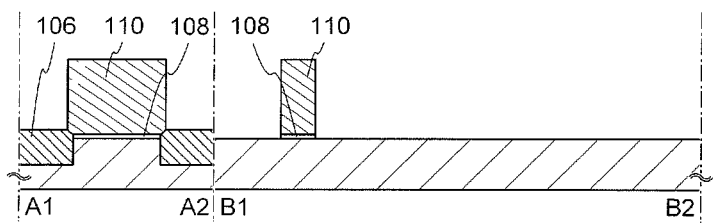

Then, an insulating layer is formed so as to cover the semiconductor region 104, and the insulating layer in a region overlapping with the semiconductor region 104 is selectively removed, whereby the element isolation insulating layer 106 is formed (see FIG. 8C). The insulating layer is formed using silicon oxide, silicon nitride, silicon oxynitride, or the like. For removing the insulating layer, any of etching treatment, polishing treatment such as CMP (chemical mechanical polishing), and the like can be employed. Note that the protective layer 102 is removed after the formation of the semiconductor region 104 or after the formation of the element isolation insulating layer 106.

Then, an insulating layer is formed on a surface of the semiconductor region 104, and a layer including a conductive material is formed over the insulating layer.

The insulating layer is to be a gate insulating layer later, and can be formed by heat treatment (thermal oxidation treatment, thermal nitridation treatment, or the like) on the surface of the semiconductor region 104, for example. High-density plasma treatment may be employed in stead of heat treatment. The high-density plasma treatment can be performed using, for example, a mixed gas of a rare gas such as He, Ar, Kr, or Xe, oxygen, nitrogen oxide, ammonia, nitrogen, hydrogen, and the like. Needless to say, the insulating layer may be formed by a CVD method, a sputtering method, or the like. The insulating layer preferably has a single-layer structure or a stacked-layer structure including silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_3$O$_y$ (x>0, y>0)) to which nitrogen is added, hafnium aluminate (HfAl$_x$O$_y$ (x>0, y>0)) to which nitrogen is added, or the like. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and any of a variety of film formation methods such as an evaporation method, a CVD method, a sputtering method, and a spin coating method can be employed. Note that in this embodiment, an example where the layer including a conductive material is formed using a metal material is described.

After that, the insulating layer and the layer including a conductive material are selectively etched, whereby the gate insulating layer 108 and the gate electrode 110 are formed (see FIG. 8C).

Figure 8D:
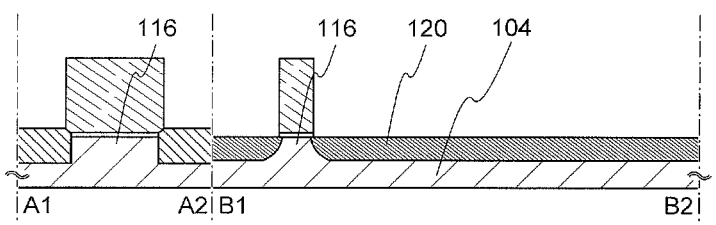

Then, phosphorus (P), arsenic (As), or the like is added to the semiconductor region 104, whereby the channel formation region 116 and the impurity region 120 are formed (see FIG. 8D). Note that phosphorus or arsenic is added here in order to form an n-channel transistor; an impurity element such as boron (B) or aluminum (Al) may be added when a p-channel transistor is formed. Here, the concentration of the impurity which is added can be set as appropriate; however, the concentration is preferably increased when the semiconductor element is highly miniaturized.

Note that a sidewall insulating layer may be formed around the gate electrode 110 and an impurity region to which an impurity element is added at a different concentration may be formed.

Figure 9A:
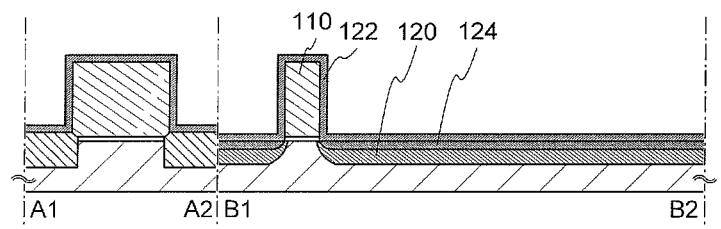
FIGS. 9A to 9C are cross-sectional views illustrating manufacturing steps of a semiconductor device.

Then, a metal layer 122 is formed so as to cover the gate electrode 110, the impurity region 120, and the like (see FIG. 9A). Any of a variety of film formation methods such as a vacuum evaporation method, a sputtering method, and a spin coating method can be employed for forming the metal layer 122. It is preferable that the metal layer 122 be formed using a metal material that reacts with a semiconductor material included in the semiconductor region 104 to form a low-resistance metal compound. Examples of such a metal material include titanium, tantalum, tungsten, nickel, cobalt, and platinum.

Then, heat treatment is performed so that the metal layer 122 may react with the semiconductor material. Thus, the metal compound region 124 which is in contact with the impurity region 120 is formed (see FIG. 9A). Note that when the gate electrode 110 is formed using polycrystalline silicon or the like, a metal compound region is also formed in a region of the gate electrode 110 which is in contact with the metal layer 122.

As the heat treatment, irradiation with a flash lamp can be employed, for example. Although it should be appreciated that another heat treatment method may be used, a method by which the heat treatment can be achieved in an extremely short time is preferably used in order to improve the controllability of chemical reaction for formation of the metal compound. Note that the metal compound region is formed by the reaction of the metal material and the semiconductor material and has sufficiently high conductivity. The formation of the metal compound region can sufficiently reduce electric resistance and improve element characteristics. Note that the metal layer 122 is removed after the metal compound region 124 is formed.

Figure 9B:
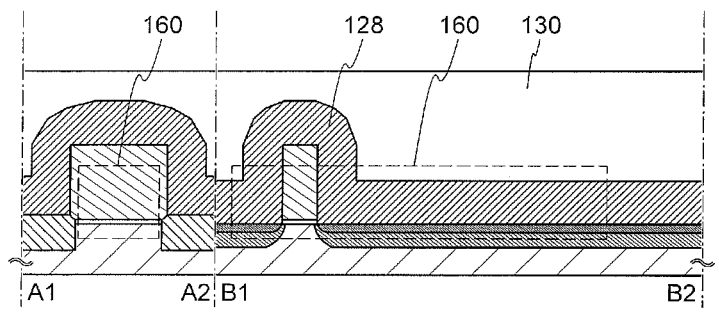

Then, the insulating layer 128 and the insulating layer 130 are formed so as to cover the components formed in the above steps (see FIG. 9B). The insulating layers 128 and 130 can be formed using a material including an inorganic insulating material such as silicon oxide, silicon oxynitride, silicon nitride, or aluminum oxide. In particular, a material with a low dielectric constant (a low-k material) is preferably used for the insulating layer 128 and the insulating layer 130, because capacitance due to overlap of electrodes or wirings can be sufficiently reduced. Note that the insulating layer 128 and the insulating layer 130 may be a porous insulating layer formed using any of those materials. A porous insulating layer has a lower dielectric constant than an insulating layer with high density, and thus allows a further reduction in capacitance generated by electrodes or wirings. Further, the insulating layer 128 and the insulating layer 130 can be formed using an organic insulating material such as polyimide or acrylic. Note that although a stacked structure of the insulating layer 128 and the insulating layer 130 is employed here, one embodiment of the disclosed invention is not limited to this. A single-layer structure or a stacked structure including three or more layers can be used.

Through the above steps, the transistor 160 is formed with the use of the substrate 100 including a semiconductor material (see FIG. 9B). The transistor 160 can operate at high speed. By using this transistor as a reading transistor, data can be read out at high speed.

Figure 9C:
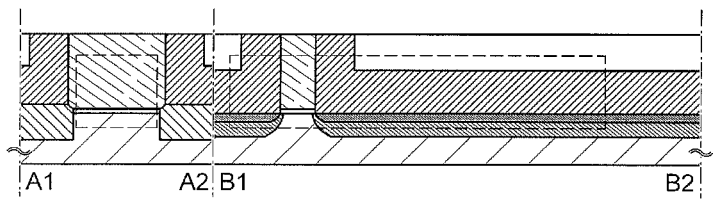

Then, as pretreatment for the formation of the transistor 162 and the capacitor 164, CMP treatment is performed on the insulating layer 128 and the insulating layer 130 to expose the upper surface of the gate electrode 110 (see FIG. 9C). As the treatment for exposing the upper surface of the gate electrode 110, etching treatment may be employed as an alternative to CMP treatment. Note that it is preferable to planarize the surfaces of the insulating layer 128 and the insulating layer 130 as much as possible in order to improve the characteristics of the transistor 162.

Note that a step of forming an electrode, a wiring, a semiconductor layer, an insulating, layer, or the like may be further included before and after each of the above steps. For example, the wiring may have a multi-layer structure including a stacked structure of an insulating layer and a conductive layer to provide a highly integrated semiconductor device.

<Method for Manufacturing Transistor in Upper Portion>

Figure 10A:
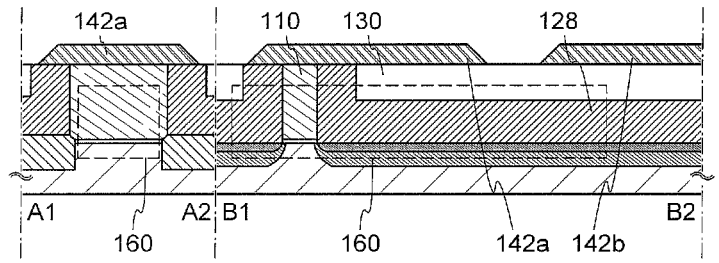
FIGS. 10A to 10D are cross-sectional views illustrating manufacturing steps of a semiconductor device.

Then, a conductive layer is formed over the gate electrode 110, the insulating layer 128, the insulating layer 130, and the like and is selectively etched, whereby the source or drain electrode 142a and the source or drain electrode 142b are formed (see FIG. 10A).

The conductive layer can be formed by a PVD method typified by a sputtering method or a CVD method such as a plasma CVD method. As a material for the conductive layer, an element selected from aluminum, chromium, copper, tantalum, titanium, molybdenum, and tungsten; an alloy including any of these elements as a component; or the like can be used. Any of manganese, magnesium, zirconium, beryllium, neodymium, scandium, or a material including any of these in combination may be used.

The conductive layer may have a single-layer structure or a stacked structure including two or more layers. For example, a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked, and the like can be given. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which may be abbreviated to ITO), an indium oxide-zinc oxide alloy ($In_2O_3$—ZnO), or any of these metal oxide materials including silicon or silicon oxide can be used.

The conductive layer is preferably etched so that end portions of the source or drain electrode 142a and the source or drain electrode 142b may be tapered. Here, the taper angle is preferably greater than or equal to 30° and less than or equal to 60°, for example. When the source or drain electrode 142a and the source or drain electrode 142b are etched to have tapered end portions, the coverage with the gate insulating layer 146 formed later can be improved and breaking thereof can be prevented.

The channel length (L) of the transistor in the upper portion is determined by the distance between a lower end portion of the source or drain electrode 142a and a lower end portion of the source or drain electrode 142b. Note that in light exposure for forming a mask for a transistor with a channel length (L) of less than 25 nm, it is preferable to use extreme ultraviolet rays whose wavelength is as short as several nanometers to several tens of nanometers. The resolution of light exposure with extreme ultraviolet rays is high and the depth of focus is large. Accordingly, the channel length (L) of the transistor formed later can be greater than or equal to 10 nm and less than or equal to 1000 nm (1 μm), whereby an operation speed of a circuit can be increased. Moreover, power consumption of the semiconductor device can be reduced by miniaturization.

Note that an insulating layer serving as a base may be provided over the insulating layer 128 and the insulating layer 130. The insulating layer can be formed by a PVD method, a CVD method, or the like.

Figure 10B:
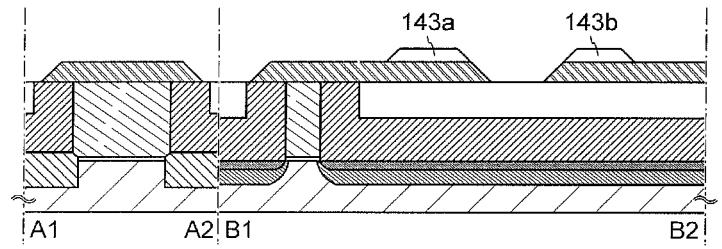

Then, the insulating layer 143a and the insulating layer 143b are formed over the source or drain electrode 142a and the source or drain electrode 142b, respectively (see FIG. 10B). The insulating layer 143a and the insulating layer 143b can be formed by forming an insulating layer so as to cover the source or drain electrode 142a and the source or drain electrode 142b and then selectively etching the insulating layer. The insulating layer 143a and the insulating layer 143b are formed to overlap with part of a gate electrode formed later. By forming those insulating layers, the capacitance between the gate electrode and the source or drain electrode can be reduced.

The insulating layers 143a and 143b can be formed using a material including an inorganic insulating material such as silicon oxide, silicon oxynitride, silicon nitride, or aluminum oxide. In particular, a material with a low dielectric constant (a low-k material) is preferably used for the insulating layer 143a and the insulating layer 143b, because the capacitance between the gate electrode and the source or drain electrode can be sufficiently reduced. Note that the insulating layer 143a and the insulating layer 143b may be a porous insulating layer formed using any of those materials. A porous insulating layer has a lower dielectric constant than an insulating layer with high density, and thus allows a further reduction in capacitance between the gate electrode and the source or drain electrode.

Note that although the insulating layers 143a and 143b are preferably provided for reduction in capacitance between the gate electrode and the source or drain electrode, the insulating layers may be omitted.

Figure 10C:
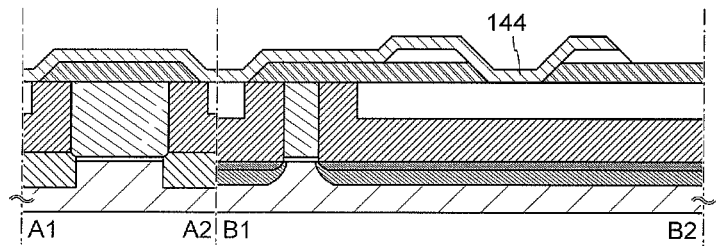
Figure 10D:
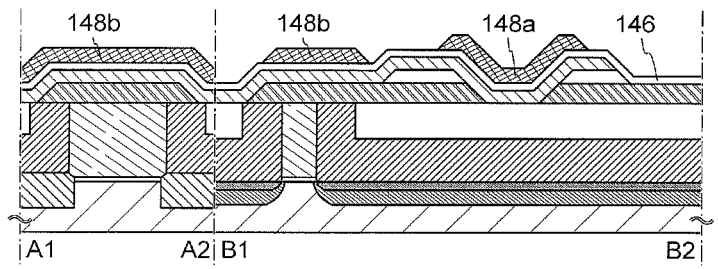

Then, after an oxide semiconductor layer is formed so as to cover the source or drain electrode 142a and the source or drain electrode 142b, the oxide semiconductor layer is selectively etched, whereby the oxide semiconductor layer 144 is formed (see FIG. 10C).

The oxide semiconductor layer can be formed using an In—Sn—Ga—Zn—O-based oxide semiconductor which is four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxide; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxide; an In—O-based oxide semiconductor, a Sn—O-based oxide semiconductor, a Zn—O-based oxide semiconductor; or the like.

In particular, an In—Ga—Zn—O-based oxide semiconductor material has sufficiently high resistance without an electric field and thus the off-state current can be sufficiently reduced. In addition, the In—Ga—Zn—O-based oxide semiconductor material has high field-effect mobility and thus is suitable as a semiconductor material used for a semiconductor device.

As a typical example of the In—Ga—Zn—O-based oxide semiconductor material, the one represented by $InGaO_3(ZnO)_m$ (m>0) is given. In addition, an oxide semiconductor material in which Ga is replaced by M and which is represented by $InMO_3(ZnO)_m$ (m>0) can also be given. Here, M denotes one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like.

Note that the above compositions are merely examples given in accordance with a crystal structure.

As a target used for forming the oxide semiconductor layer by a sputtering method, a target having a composition ratio expressed by the equation In:Ga:Zn=1:x:y (x is 0 or more, and y is 0.5 to 5) is preferable. For example, a target having a composition ratio expressed by the equation In:Ga:Zn=1:1:1 [atomic ratio] (x=1, y=1) (that is, $In_2O_3:Ga_2O_3:ZnO$=1:1:2 [molar ratio]), or the like can be used. Alternatively, a target having a composition ratio expressed by the equation In:Ga:Zn=1:1:1 [atomic ratio] (x=1, y=0.5), a target having a composition ratio expressed by the equation In:Ga:Zn=1:1:2 [atomic ratio] (x=1, y=2), or a target having a composition ratio expressed by the equation In:Ga:Zn=1:0:1 [atomic ratio] (x=0, y=1) can be used.

In this embodiment, the oxide semiconductor layer having an amorphous structure is formed by a sputtering method using an In—Ga—Zn—O-based metal oxide target.

The relative density of the metal oxide in the metal oxide target is 80% or higher, preferably 95% or higher, more preferably 99.9% or higher. The use of the metal oxide target having high relative density makes it possible to form the oxide semiconductor layer having a dense structure.

The atmosphere in which the oxide semiconductor layer is formed is preferably a rare gas (typically argon) atmosphere, an oxygen atmosphere, or a mixed atmosphere including a rare gas (typically argon) and oxygen. Specifically, for example, an atmosphere of a high-purity gas is preferable from which impurities such as hydrogen, water, hydroxyl, or hydride are removed so that the concentration thereof is reduced to 1 ppm or less (preferably to 10 ppb or less).

In the formation of the oxide semiconductor layer, for example, an object to be processed is held in a process chamber that is kept under reduced pressure and the object is heated so that the temperature of the object becomes higher than or equal to 100° C. and lower than 550° C., preferably higher than or equal to 200° C. and lower than or equal to 400° C. Alternatively, the temperature of the object in the formation of the oxide semiconductor layer may be room temperature (25° C.±10° C.). Moisture in the process chamber is removed, a sputtering gas from which hydrogen, water, and the like are removed is introduced, and the above target is used, and thus the oxide semiconductor layer is formed. By forming the oxide semiconductor layer while heating the object, impurities in the oxide semiconductor layer can be reduced. In addition, damage by sputtering can be reduced. In order to remove moisture in the process chamber, an entrapment vacuum pump is preferably used. For example, a cryopump, an in pump, a titanium sublimation pump, or the like can be used. Further, a turbo molecular pump provided with a cold trap may be used. By evacuation with the cryopump or the like, hydrogen, water, and the like can be removed from the process chamber, whereby the impurity concentration in the oxide semiconductor layer can be reduced.

The oxide semiconductor layer can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferable because dust (such as powdery substances formed at the time of film formation) can be reduced and the film thickness can be uniform. The thickness of the oxide semiconductor layer is greater than or equal to 1 nm and less than or equal to 50 nm, preferably greater than or equal to 1 nm and less than or equal to 30 nm, more preferably greater than or equal to 1 nm and less than or equal to 10 nm. With the oxide semiconductor layer having such a thickness, a short-channel effect which occurs along with miniaturization can be suppressed. Note that the appropriate thickness differs depending on the oxide semiconductor material to be used, the intended use of the semiconductor device, or the like; therefore, the thickness can also be determined in accordance with the material, the intended use, or the like.

Note that before the oxide semiconductor layer is formed by a sputtering method, a substance attached to a surface where the oxide semiconductor layer is to be formed (e.g., a surface of the insulating layer 130) is preferably removed by reverse sputtering in which an argon gas is introduced and plasma is generated. Here, the reverse sputtering refers to a method in which ions collide with a surface to be processed in order to modify the surface, in contrast to normal sputtering in which ions collide with a sputtering target. As a method for making ions collide with a surface to be processed, a method is given for example where high-frequency voltage is applied to the surface to be processed in an argon atmosphere and plasma is generated in the vicinity of the object to be processed. Note that the atmosphere may be nitrogen, helium, oxygen, or the like instead of an argon atmosphere.

After that, heat treatment (first heat treatment) is preferably performed on the oxide semiconductor layer. By the first heat treatment, excessive hydrogen (including water and hydroxyl) in the oxide semiconductor layer can be removed, the structure of the oxide semiconductor layer can be improved, and defect levels in the energy gap can be reduced. The temperature of the first heat treatment is, for example, higher than or equal to 300° C. and lower than 550° C., or higher than or equal to 400° C. and lower than or equal to 500° C.

The heat treatment can be performed in such a manner that, for example, the object to be processed is introduced into an electric furnace provided with a resistance heating element or the like and heated at 450° C. for one hour in a nitrogen atmosphere. During the heat treatment, the oxide semiconductor layer is not exposed to air to prevent entry of water and hydrogen.

The heat treatment apparatus is not limited to the electric furnace and may be an apparatus for heating an object by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

For example, as the first heat treatment, GRTA treatment may be performed in which the object is put in a heated inert gas atmosphere and heated for several minutes, and then taken out of the inert gas atmosphere. GRTA treatment enables high-temperature heat treatment for a short time. Moreover, GRTA treatment enables treatment at a temperature which exceeds the upper temperature limit of the object. Note that the inert gas may be changed to a gas including oxygen during the treatment. This is because defect levels in the energy gap due to oxygen vacancies can be reduced by performing the first heat treatment in an atmosphere including oxygen.

Note that as the inert gas atmosphere, an atmosphere that includes nitrogen or a rare gas (such as helium, neon, or argon) as a main component and does not include water, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (that is, the impurity concentration is lower than or equal to 1 ppm, preferably lower than or equal to 0.1 ppm).

In any case, impurities are reduced by the first heat treatment so that the i-type (intrinsic) or substantially i-type oxide semiconductor layer is obtained. Accordingly, a transistor having significantly excellent characteristics can be realized.

The above heat treatment (first heat treatment) has an effect of removing hydrogen, water, and the like and thus can be referred to as dehydration treatment, dehydrogenation treatment, or the like. The dehydration treatment or the dehydrogenation treatment can also be performed at the following timing: after the formation of the oxide semiconductor layer, after the formation of the gate insulating layer, after the formation of the gate electrode, or the like. Such dehydration treatment or dehydrogenation treatment may be performed once or more times.

The etching of the oxide semiconductor layer may be performed before or after the heat treatment. In addition, although dry etching is favorable in terms of miniaturization of elements, wet etching may be used. An etching gas and an etchant can be selected as appropriate in accordance with a material to be etched. Note that in the case where a problem of leakage current and the like between elements does not occur, the oxide semiconductor layer may be used without being etched into an island shape.

Then, the gate insulating layer 146 is formed in contact with the oxide semiconductor layer 144. After that, over the gate insulating layer 146, the gate electrode 148a is formed in a region overlapping with the oxide semiconductor layer 144 and the electrode 148b is formed in a region overlapping with the source or drain electrode 142a (see FIG. 10D).

The gate insulating layer 146 can be formed by a CVD method, a sputtering method, or the like. The gate insulating layer 146 preferably includes silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked structure. There is no particular limitation on the thickness of the gate insulating layer 146; in the case where the semiconductor device is miniaturized, the gate insulating layer 146 is preferably thin in order to ensure the operation of the transistor. For example, in the case of using silicon oxide, the thickness can be greater than or equal to 1 nm and less than or equal to 100 nm, preferably greater than or equal to 10 nm and less than or equal to 50 nm.

When the gate insulating layer is thin as in the above description, a problem of gate leakage due to a tunneling effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate ($HfSi_3O_y$ (x>0, y>0)) to which nitrogen is added, or hafnium aluminate ($HfAl_xO_y$ (x>0, y>0)) to which nitrogen is added. With the use of a high-k material for the gate insulating layer 146, the thickness of the gate insulating layer 146 can be increased to prevent gate leakage and at the same time electrical characteristics can be maintained. Note that a stacked structure of a film including a high-k material and a film including any of silicon oxide, silicon nitride, silicon oxynitride, silicon nitride oxide, aluminum oxide, and the like may be employed.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electric characteristics of the transistors. Moreover, in the case where the gate insulating layer 146 includes oxygen, oxygen can be supplied to the oxide semiconductor layer 144 and oxygen vacancies in the oxide semiconductor layer 144 can be filled; thus, an i-type (intrinsic) or substantially i-type oxide semiconductor layer can be formed.

Note that the second heat treatment is performed after the gate insulating layer 146 is formed in this embodiment; however, the timing of the second heat treatment is not limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

As described above, at least one of the first heat treatment and the second heat treatment is employed, whereby impurities which are not the main components of the oxide semiconductor are excluded as much as possible and the oxide semiconductor layer 144 can be highly purified.

The gate electrode 148a and the electrode 148b can be formed by forming a conductive layer over the gate insulating layer 146 and then selectively etching the conductive layer. The conductive layer to be processed into the gate electrode 148a and the electrode 148b can be formed by a PVD method typified by a sputtering method or a CVD method such as a plasma CVD method. The details are similar to those of the source or drain electrode 142a or the like; thus, description thereof can be referred to.

Figure 11A:
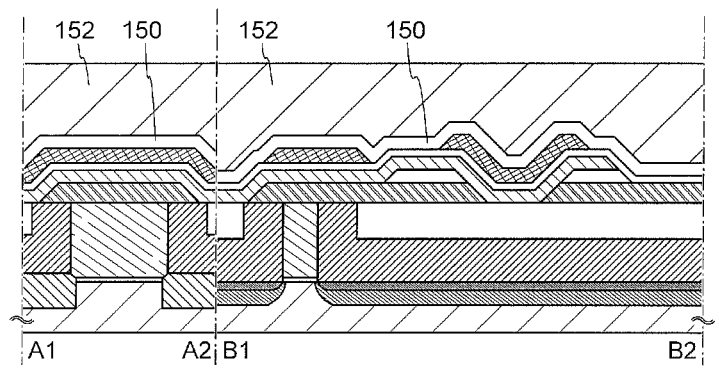
FIGS. 11A to 11C are cross-sectional views illustrating manufacturing steps of a semiconductor device.

Then, the insulating layer 150 and the insulating layer 152 are formed over the gate insulating layer 146, the gate electrode 148a, and the electrode 148b (see FIG. 11A). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Note that for the insulating layer 150 and the insulating layer 152, a material with a low dielectric constant may be preferably used or a structure with a low dielectric constant (e.g., a porous structure) may be preferably employed. This is because by reducing the dielectric constant of the insulating layer 150 and the insulating layer 152, capacitance between wirings and electrodes can be reduced, which will increase operation speed.

Note that although a stacked structure of the insulating layer 150 and the insulating layer 152 is employed in this embodiment, one embodiment of the disclosed invention is not limited to this. A single-layer structure or a stacked structure including three or more layers can be used. Alternatively, the insulating layer may be omitted.

Note that the insulating layer 152 is preferably formed so as to have a planarized surface. By forming the insulating layer 152 having a planarized surface, an electrode, a wiring, or the like can be favorably formed over the insulating layer 152 even in the case where the semiconductor device is miniaturized, for example. The insulating layer 152 can be planarized by a method such as chemical mechanical polishing (CMP).

Figure 11B:
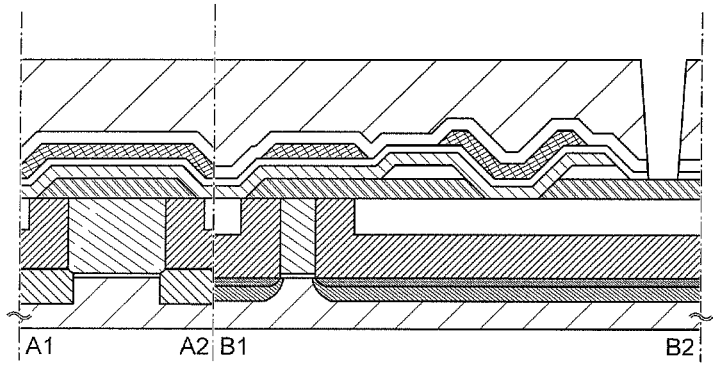

Then, an opening reaching the source or drain electrode 142b is formed in the gate insulating layer 146, the insulating layer 150, and the insulating layer 152 (see FIG. 11B). The opening is formed by selective etching using a mask or the like.

Figure 11C:
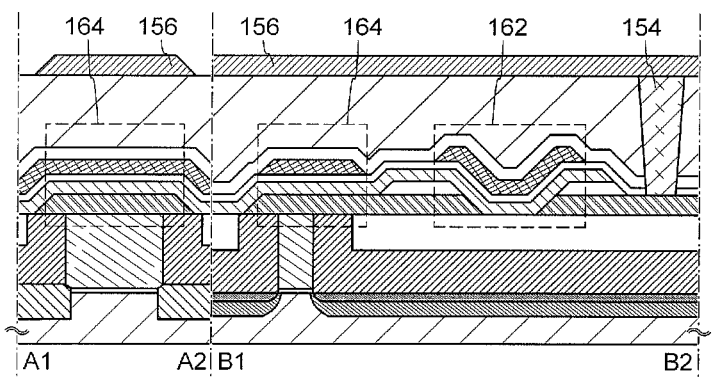

Then, the electrode 154 is formed in the opening and the wiring 156 in contact with the electrode 154 is formed over the insulating layer 152 (see FIG. 11C).

The electrode 154 can be formed in such a manner that, for example, a conductive layer is formed by a PVD method, a CVD method, or the like in a region including the opening and then part of the conductive layer is removed by etching treatment, CMP, or the like.

More specifically, it is possible to employ a method in which a thin titanium film is formed by a PVD method in a region including the opening, a thin titanium nitride film is formed by a CVD method, and then a tungsten film is formed so as to fill the opening. Here, the titanium film formed by a PVD method has a function of reducing an oxide film (such as a natural oxide film) over which the titanium film is to be formed, and thereby lowering contact resistance with lower electrodes or the like (the source or drain electrode 142b, here). The titanium nitride film formed after the formation of the titanium film has a barrier function of suppressing diffusion of the conductive material. A copper film may be formed by a plating method after the formation of the barrier film of titanium, titanium nitride, or the like.

Note that in the case where the electrode 154 is formed by removing part of the conductive layer, it is preferable that surface of the electrode 154 is be processed to be flat. For example, when a thin titanium film or a thin titanium nitride film is formed in a region including the opening and then a tungsten film is formed so as to fill the opening, an unnecessary portion of the tungsten film, titanium film, titanium nitride film, or the like can be removed and the planarity of the surface of the electrode 154 is can be improved by subsequent CMP treatment. By planarizing the surface including the electrode 154 in this manner, an electrode, a wiring, an insulating layer, a semiconductor layer, and the like can be favorably formed in later steps.

The wiring 156 is formed by a PVD method typified by a sputtering method or a CVD method such as a plasma CVD method and then patterning the conductive layer. As a material for the conductive layer, an element selected from aluminum, chromium, copper, tantalum, titanium, molybdenum, or tungsten; an alloy including any of these elements as a component; or the like can be used. Any of manganese, magnesium, zirconium, beryllium, neodymium, scandium, or a material including any of these in combination may be used. The details are similar to those of the source or drain electrode 142a or the like.

Through the above steps, the transistor 162 including the highly purified oxide semiconductor layer 144 and the capacitor 164 are completed (see FIG. 11C).

In the transistor 162 described in this embodiment, the oxide semiconductor layer 144 is highly purified and thus the hydrogen concentration therein is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. The carrier density of the oxide semiconductor layer 144 is sufficiently low (e.g., lower than $1 \times 10^{12}/cm^3$, preferably lower than $1.45 \times 10^{10}/cm^3$) as compared to the carrier density of a general silicon wafer (approximately $1 \times 10^{14}/cm^3$). Accordingly, the off-state current of the transistor 162 is also sufficiently small. For example, the off-state current (here, current per micrometer (μm) of channel width) of the transistor 162 at room temperature (25° C.) is 100 zA (1 zA (zeptoampere) is $1 \times 10^{-21}$ A) or less, preferably 10 zA or less.

With the use of the highly purified intrinsic oxide semiconductor layer 144, the off-state current of the transistor can be sufficiently reduced easily. Further, with the use of such a transistor, a semiconductor device capable of holding stored data for an extremely long time can be obtained.

The structures, methods, and the like described in this embodiment can be combined as appropriate with any of the structures and methods described in the other embodiments.

Embodiment 3

In this embodiment, an example of application of the semiconductor device described in the above embodiment will be described with reference to FIGS. 12A and 12B, FIGS. 13A and 13B, FIGS. 14A and 14B, and FIGS. 15A to 15C.

Figure 12A:
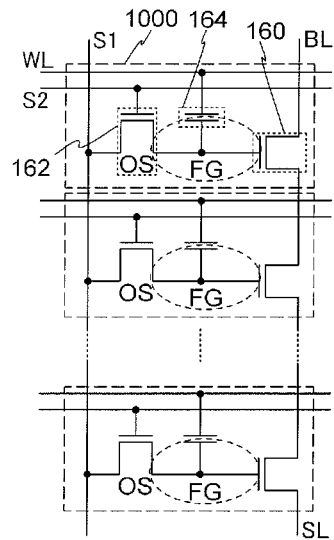
FIGS. 12A and 12B are circuit diagrams of semiconductor devices.
Figure 12B:
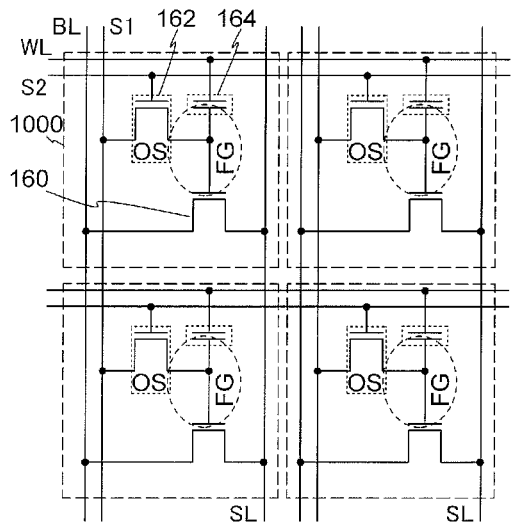

FIGS. 12A and 12B are circuit diagrams of semiconductor devices each including a plurality of semiconductor devices (hereinafter also referred to as memory cells 1000) illustrated in FIG. 2. FIG. 12A is a circuit diagram of a so-called NAND semiconductor device in which the memory cells 1000 are connected in series, and FIG. 12B is a circuit diagram of a so-called NOR semiconductor device in which the memory cells 1000 are connected in parallel.

The semiconductor device in FIG. 12A includes a source line SL, a bit line BL, a first signal line S1, a plurality of second signal lines S2, a plurality of word lines WL, and the plurality of memory cells 1000. In FIG. 12A, one source line SL and one bit line BL are provided in the semiconductor device; however, one embodiment of the disclosed invention is not limited to this structure. A plurality of source lines SL and a plurality of bit lines BL may be provided. Note that the potential converter circuit described in the above embodiment is connected to the second signal line S2.

In each of the memory cells 1000, the gate electrode of the transistor 160, one of the source electrode and the drain electrode of the transistor 162, and one electrode of the capacitor 164 are electrically connected to one another. The first signal line S1 and the other of the source electrode and the drain electrode of the transistor 162 are electrically connected to each other, and the second signal line S2 and the gate electrode of the transistor 162 are electrically connected to each other. The word line WL and the other electrode of the capacitor 164 are electrically connected to each other.

Further, the source electrode of the transistor 160 included in the memory cell 1000 is electrically connected to the drain electrode of the transistor 160 in the adjacent memory cell 1000. The drain electrode of the transistor 160 included in the memory cell 1000 is electrically connected to the source electrode of the transistor 160 in the adjacent memory cell 1000. Note that the drain electrode of the transistor 160 included in the memory cell 1000 at one end of the plurality of memory cells connected in series is electrically connected to the bit line BL. The source electrode of the transistor 160 included in the memory cell 1000 at the other end of the plurality of memory cells connected in series is electrically connected to the source line SL.

In the semiconductor device in FIG. 12A, writing operation and reading operation are performed for each row. The writing operation is performed as follows. A potential at which the transistor 162 is turned on is supplied to the second signal line S2 of a row where writing is to be performed, so that the transistor 162 of the row where writing is to be performed is turned on. Accordingly, a potential of the first signal line S1 is supplied to the gate electrode of the transistor 160 of the specified row, so that predetermined charge is applied to the gate electrode. Thus, data can be written to the memory cell of the specified row.

Further, the reading operation is performed as follows. First, a potential at which the transistor 160 is turned on regardless of charge of the gate electrode thereof is supplied to the word lines WL of the rows other than the row where reading is to be performed, so that the transistors 160 of the rows other than the row where reading is to be performed are turned on. Then, a potential (reading potential) at which an on state or an off state of the transistor 160 is determined depending on charge of the gate electrode of the transistor 160 is supplied to the word line WL of the row where reading is to be performed. After that, a constant potential is supplied to the source line SL so that a reading circuit (not illustrated) connected to the bit line BL is operated. Here, the plurality of transistors 160 between the source line SL and the bit line BL are turned on except the transistor 160 of the row where reading is to be performed; therefore, conductance between the source line SL and the bit line BL is determined by the state of the transistor 160 of the row where reading is to be performed. That is, the potential of the bit line BL read by the reading circuit depends on charge of the gate electrode of the transistor 160 of the row where reading is to be performed. In such a manner, data can be read from the memory cell of the specified row.

The semiconductor device in FIG. 12B includes a plurality of source lines SL, a plurality of bit lines BL, a plurality of first signal lines S1, a plurality of second signal lines S2, a plurality of word lines WL, and a plurality of memory cells 1000. The gate electrode of the transistor 160, one of the source electrode and the drain electrode of the transistor 162, and one electrode of the capacitor 164 are electrically connected to one another. The source line SL and the source electrode of the transistor 160 are electrically connected to each other. The bit line BL and the drain electrode of the transistor 160 are electrically connected to each other. The first signal line S1 and the other of the source electrode and the drain electrode of the transistor 162 are electrically connected to each other, and the second signal line S2 and the gate electrode of the transistor 162 are electrically connected to each other. The word line WL and the other electrode of the capacitor 164 are electrically connected to each other. Note that the potential converter circuit described in the above embodiment is connected to the second signal line S2.

In the semiconductor device in FIG. 12B, writing operation and reading operation are performed for each row. The writing operation is performed in a manner similar to that of the semiconductor device in FIG. 12A. The reading operation is performed as follows. First, a potential at which the transistor 160 is turned off regardless of charge of the gate electrode thereof is supplied to the word lines WL of the rows other than the row where reading is to be performed, so that the transistors 160 of the rows other than the row where reading is to be performed are turned off. Then, a potential (a reading potential) at which an on state or an off state of the transistor 160 is determined depending on charge of the gate electrode of the transistor 160 is supplied to the word line WL of the row where reading is to be performed. After that, a constant potential is supplied to the source line SL so that a reading circuit (not illustrated) connected to the bit line BL is operated. Here, conductance between the source line SL and the bit line BL is determined by the state of the transistor 160 of the row where reading is to be performed. That is, a potential of the bit line BL read by the reading circuit depends on charge of the gate electrode of the transistor 160 of the row where reading is to be performed. In such a manner, data can be read from the memory cell of the specified row.

Figure 13A:
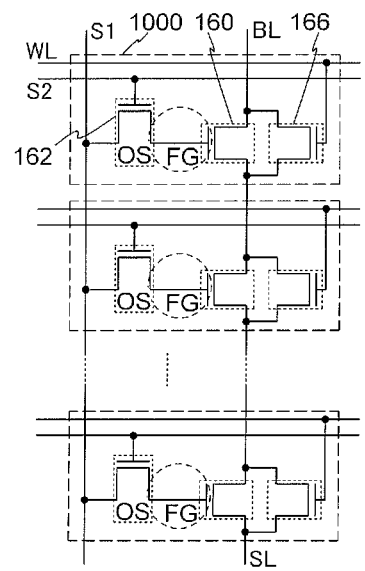
FIGS. 13A and 13B are circuit diagrams of semiconductor devices.
Figure 13B:
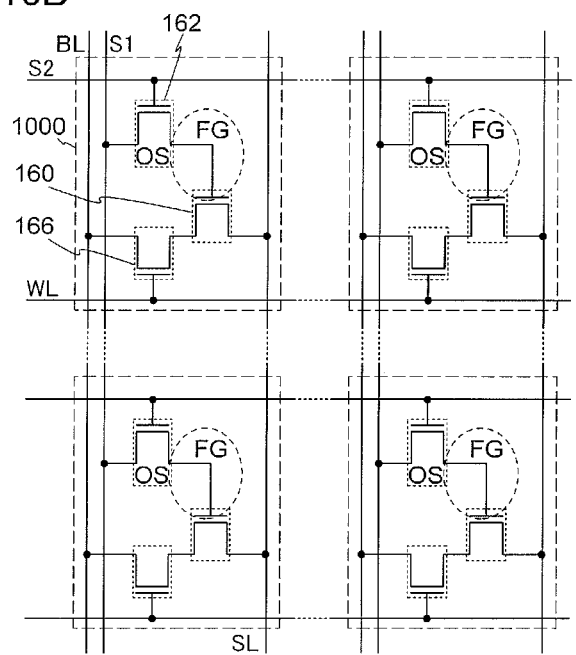

FIGS. 13A and 13B illustrate modified examples of the semiconductor devices illustrated in FIGS. 12A and 12B, respectively. That is, FIG. 13A is a circuit diagram of a so-called NAND semiconductor device in which the memory cells 1000 are connected in series, and FIG. 13B is a circuit diagram of a so-called NOR semiconductor device in which the memory cells 1000 are connected in parallel.

FIGS. 13A and 13B are different from FIGS. 12A and 12B respectively in the absence of the capacitor 164 and the presence of a transistor 166. That is, in FIGS. 13A and 13B, the capacitor 164 is not provided and the transistor 166 is provided. Note that the floating gate portion FG has such capacitance as can hold data, like capacitance of the transistor. The potential converter circuit described in the above embodiment is connected to the second signal line S2.

Data-writing operation and data-reading operation are performed as in the structures in FIGS. 12A and 12B. However, the structures in FIGS. 13A and 13B are different from those in FIGS. 12A and 12B in that data-writing operation and data-reading operation are performed not by control of the capacitor 164 but by control of the transistor 166.

For example, in the structure in FIG. 13A, the transistor 166 included in the memory cell from which data is to be read is turned off and the transistor 166 in the memory cell from which data is not to be read is turned on, whereby conductance of the transistor 160 in the memory cell from which data is to be read can be read. In the structure in FIG. 13B, the transistor 166 in the memory cell from which data is to be read is turned on and the transistor 166 in the memory cell from which data is not to be read is turned off, whereby conductance of the transistor 160 in the memory cell from which data is to be read can be read.

Figure 14A:
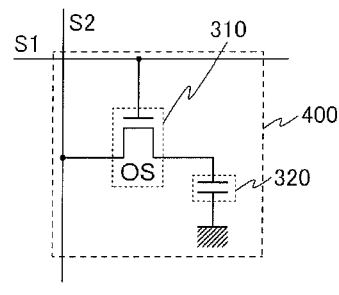
FIGS. 14A and 14B are circuit diagrams of semiconductor devices.
Figure 14B:
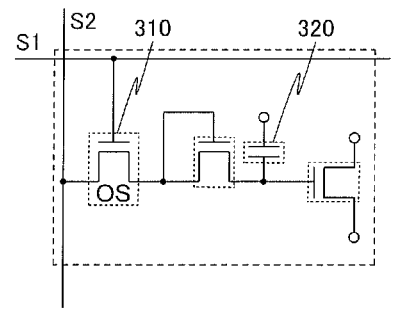

FIGS. 14A and 14B each show another example of a semiconductor device including a potential converter circuit.

FIG. 14A shows a semiconductor device whose circuit structure is similar to the structure of a so-called DRAM. Data is written and read by control of an on state and an off state of a transistor 310. In the semiconductor device described here, an oxide semiconductor material is used for the transistor 310; thus, the semiconductor device can hold data for a long time as compared with a normal DRAM. Therefore, the frequency of refresh operation can be sufficiently suppressed. Note that the potential converter circuit described in the above embodiment is connected to the second signal line S2.

FIG. 14B is a write-once semiconductor device. Data is written and read by control of an on state and an off state of the transistor 310. Note that the potential converter circuit described in the above embodiment is connected to the second signal line S2.

Next, examples of reading circuits which can be used for the semiconductor devices in FIGS. 12A and 12B, FIGS. 13A and 13B, FIGS. 14A and 14B, or the like will be described with reference to FIGS. 15A to 15C.

FIG. 15A illustrates an outline of the reading circuit. The reading circuit includes a transistor and a sense amplifier circuit.

At the time of reading data, a terminal A is connected to a bit line BL connected to a memory cell from which data is to be read. Further, a bias potential Vbias is applied to a gate electrode of the transistor so that a potential of the terminal A is controlled.

The resistance of the memory cell 1000 varies depending on stored data. Specifically, when the transistor 160 of the selected memory cell 1000 is turned on, the memory cell 1000 has a low resistance, whereas when the transistor 160 of the selected memory cell 1000 is turned off, the memory cell 1000 has a high resistance.

When the memory cell has a high resistance, the potential of the terminal A is higher than a reference potential Vref and the sense amplifier circuit outputs a potential (data "1") corresponding to the potential of the terminal A. On the other hand, when the memory cell has a low resistance, the potential of the terminal A is lower than the reference potential Vref and the sense amplifier circuit outputs a potential (data "0") corresponding to the potential of the terminal A.

In this manner, by using the reading circuit, data can be read from the memory cell. Note that the reading circuit of this embodiment is one example. Another known circuit may be used. The reading circuit may further include a precharge circuit. Instead of the reference potential Vref, a reference bit line may be connected to the sense amplifier circuit.

FIG. 15B illustrates a differential sense amplifier which is an example of sense amplifier circuits. The differential sense amplifier has input terminals Vin(+) and Vin(−) and an output terminal Vout, and amplifies a difference between Vin(+) and Vin(−). If Vin(+)>Vin(−), the output from Vout is relatively high, whereas if Vin(+)<Vin(−), the output from Vout is relatively low.

FIG. 15C illustrates a latch sense amplifier which is an example of sense amplifier circuits. The latch sense amplifier has input/output terminals V1 and V2 and input terminals for control signals Sp and Sn. First, the signal Sp is set high and the signal Sn is set low, and a power supply potential (Vdd) is interrupted. Then, potentials to be compared are supplied to V1 and V2. After that, the signal Sp is set low and the signal Sn is set high, and a power supply potential (Vdd) is supplied. If the potentials of V1in and V2in to be compared satisfy V1in>V2in, the output from V1 is high and the output from V2 is low, whereas if the potentials satisfy V1in<V2in, the output from V1 is low and the output from V2 is high. By utilizing such a relationship, the difference between V1in and V2in can be amplified.

The structures, methods, and the like described in this embodiment can be combined as appropriate with any of the structures, methods, and the like described in the other embodiments.

Embodiment 4

In this embodiment, the case where the semiconductor device described in any of the above embodiments is applied to an electronic device will be described with reference to FIGS. 16A to 16F. In this embodiment, the case where the above semiconductor device is applied to electronic devices such as a computer, a mobile phone (also referred to as a mobile telephone or a mobile telephone device), a portable information terminal (including a portable game console, an audio player, and the like), a camera such as a digital camera or a digital video camera, an electronic paper, and a television device (also referred to as a television or a television receiver) will be described.

Figure 16A:
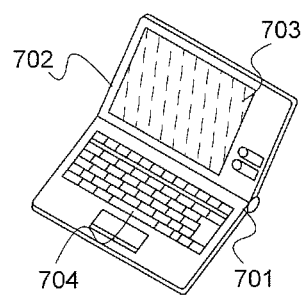
FIGS. 16A to 16F each illustrate an electronic device including a semiconductor device.

FIG. 16A is a notebook personal computer including a housing 701, a housing 702, a display portion 703, a keyboard 704, and the like. The semiconductor device described in any of the above embodiments is provided in the housing 701 and the housing 702. Consequently, the notebook personal computer can perform writing and reading of data at high speed and store data for a long time with sufficiently reduced power consumption.

Figure 16D:
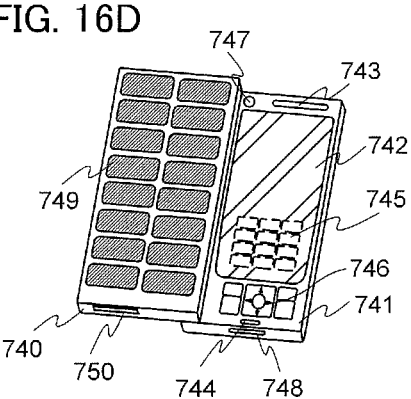
Figure 16B:
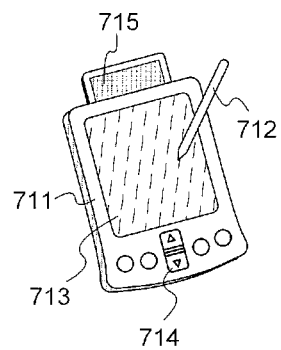

FIG. 16B is a portable information terminal (personal digital assistant (PDA)). A main body 711 is provided with a display portion 713, an external interface 715, operation buttons 714, and the like. Further, a stylus 712 for operating the portable information terminal or the like is also provided. The semiconductor device described in any of the above embodiments is provided in the main body 711. Consequently, the portable information terminal can perform writing and reading of data at high speed and store data for a long time with sufficiently reduced power consumption.

Figure 16E:
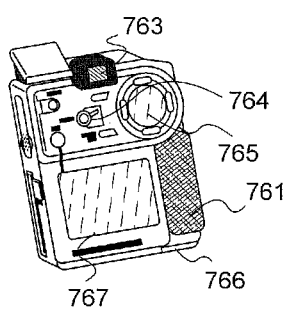
Figure 16C:
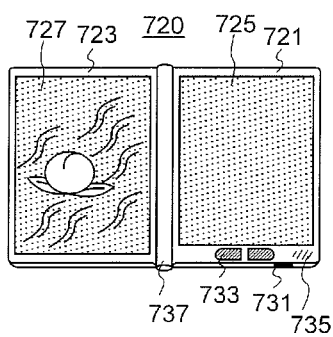

FIG. 16C is an e-book reader 720 mounted with an electronic paper. The e-book reader has two housings, a housing 721 and a housing 723. The housing 721 and the housing 723 are provided with a display portion 725 and a display portion 727, respectively. The housing 721 and the housing 723 are connected by a hinge 737 and can be opened and closed along the hinge 737. Further, the housing 721 is provided with a power switch 731, operation keys 733, a speaker 735, and the like. At least one of the housing 721 and the housing 723 is provided with the semiconductor device described in any of the above embodiments. Consequently, the e-book reader can perform writing and reading of data at high speed and store data for a long time with sufficiently reduced power consumption.

FIG. 16D is a mobile phone including two housings, a housing 740 and a housing 741. Further, the housing 740 and the housing 741 in a state where they are developed as illustrated in FIG. 16D can shift by sliding so that one is lapped over the other; therefore, the size of the mobile phone can be reduced, which makes the mobile phone suitable for being carried. The housing 741 is provided with a display panel 742, a speaker 743, a microphone 744, a pointing device 746, a camera lens 747, an external connection terminal 748, and the like. The housing 740 is provided with a solar cell 749 that charges the mobile phone, an external memory slot 750, and the like. In addition, an antenna is incorporated in the housing 741. At least one of the housing 740 and the housing 741 is provided with the semiconductor device described in any of the above embodiments. Consequently, the mobile phone can perform writing and reading of data at high speed and store data for a long time with sufficiently reduced power consumption.

FIG. 16E is a digital video camera including a main body 761, a display portion 767, an eyepiece 763, an operation switch 764, a display portion 765, a battery 766, and the like. The semiconductor device described in any of the above embodiments is provided in the main body 761. Consequently, the digital video camera can perform writing and reading of data at high speed and store data for a long time with sufficiently reduced power consumption.

Figure 16F:
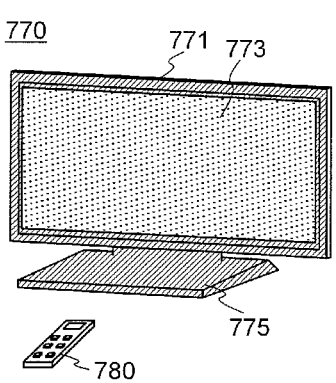

FIG. 16F is a television device 770 including a housing 771, a display portion 773, a stand 775, and the like. The television device 770 can be operated by an operation switch of the housing 771 or a remote controller 780. The housing 771 and the remote controller 780 are mounted with the semiconductor device described in any of the above embodiments. Consequently, the television device can perform writing and reading of data at high speed and store data for a long time with sufficiently reduced power consumption.

Thus, the electronic devices described in this embodiment are mounted with the semiconductor device according to any of the above embodiments. Accordingly, electronic devices with low power consumption can be realized.

Example 1

In this example, measurement results of the off-state current of a transistor including a highly purified oxide semiconductor will be described.

Figure 17:
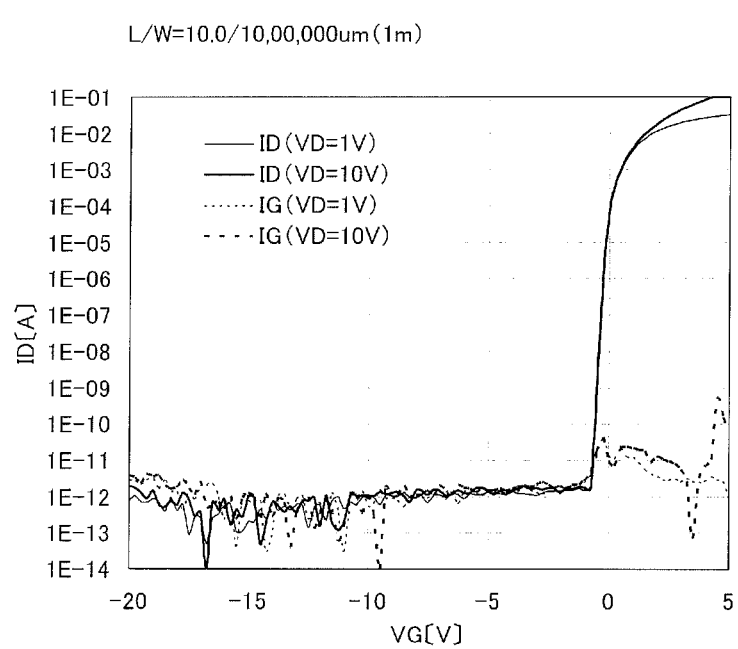
FIG. 17 is a graph showing characteristics of a transistor including an oxide semiconductor.

First, a transistor with a channel width W of 1 m, which was sufficiently large, was prepared in consideration of the fact that off-state current of a transistor including a highly purified oxide semiconductor is extremely small, and the off-state current was measured. FIG. 17 shows the results obtained by the measurement of the off-state current of the transistor with a channel width W of 1 m. In FIG. 17, the horizontal axis represents a gate voltage VG and the vertical axis represents a drain current ID. In the case where the drain voltage VD is +1 V or +10 V and the gate voltage VG is within the range of −5 V to −20 V, the off-state current of the transistor was found to be smaller than or equal to $1 \times 10^{-13}$ A, which is the detection limit. In addition, it was found that the off-state current (here, current per micrometer (μm) of channel width) of the transistor is smaller than or equal to 1 aA/μm ($1 \times 10^{-18}$ A/μm).

Described next are the results obtained by more accurately measuring the off-state current of the transistor including a highly purified oxide semiconductor. As described above, the off-state current of the transistor including a highly purified oxide semiconductor was found to be smaller than or equal to $1 \times 10^{-13}$ A, which is the detection limit of the measurement equipment. Here, the results obtained by measuring a more accurate off-state current value (the value smaller than or equal to the detection limit of the measurement equipment in the above measurement), with the use of an element for characteristic evaluation will be described.

First, the element for characteristic evaluation which was used in a method for measuring current will be described with reference to FIG. 18.

Figure 18:
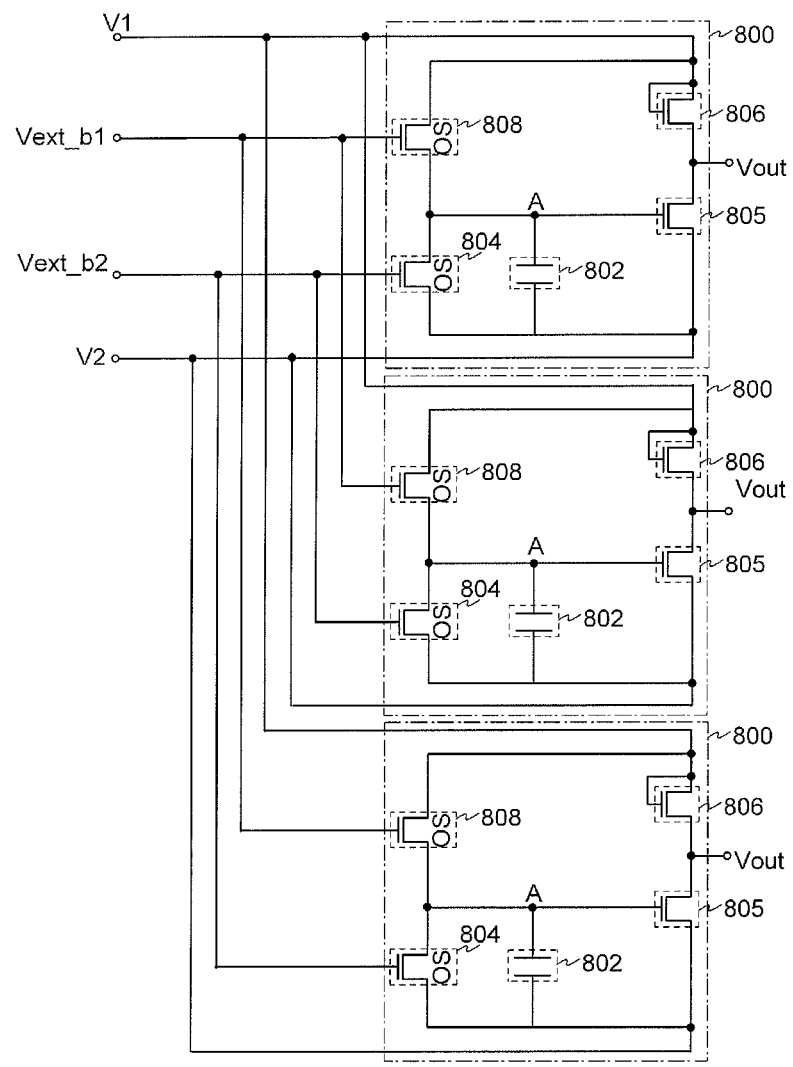
FIG. 18 is a circuit diagram for evaluating characteristics of a transistor including an oxide semiconductor.

In the element for characteristic evaluation in FIG. 18, three measurement systems 800 are connected in parallel. The measurement system 800 includes a capacitor 802, a transistor 804, a transistor 805, a transistor 806, and a transistor 808. A transistor including a highly purified oxide semiconductor was used as each of the transistor 804 and the transistor 808.

In the measurement system 800, one of a source terminal and a drain terminal of the transistor 804, one terminal of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other terminal of the capacitor 802, and a gate terminal of the transistor 805 are connected to one another. The other of the source terminal and the drain terminal of the transistor 808, one of a source terminal and a drain terminal of the transistor 806, and a gate terminal of the transistor 806 are connected to a power source (for supplying V1). The other of the source terminal and the drain terminal of the transistor 805 and the other of the source terminal and the drain terminal of the transistor 806 are connected to each other to form an output terminal which outputs a potential Vout.

A potential Vext_b2 for controlling whether to turn on or off the transistor 804 is supplied to a gate terminal of the transistor 804. A potential Vext_b1 for controlling whether to turn on or off the transistor 808 is supplied to the gate terminal of the transistor 808. A potential Vout is output from the output terminal.

Next, a method for measuring current with the use of the element for characteristic evaluation will be described.

First, an initialization period in which a potential difference is applied to measure the off-state current will be described briefly. In the initialization period, the potential Vext_b1 for turning on the transistor 808 is input to the gate terminal of the transistor 808, and a potential V1 is applied to a node A which is a node connected to the other of the source terminal and the drain terminal of the transistor 804 (that is, the node connected to one of the source terminal and the drain terminal of the transistor 808, the other terminal of the capacitor 802, and the gate terminal of the transistor 805). Here, the potential V1 is, for example, a high potential. The transistor 804 is kept in an off state.

After that, the potential Vext_b1 for turning off the transistor 808 is input to the gate terminal of the transistor 808, whereby the transistor 808 is turned off. After the transistor 808 is turned off, the potential V1 is set to a low potential. The transistor 804 is still in an off state. The potential V2 is set to the same potential as the potential V1. Thus, the initialization period is completed. When the initialization period is completed, a potential difference is generated between the node A and the one of the source electrode and the drain electrode of the transistor 804, and a potential difference is also generated between the node A and the other of the source electrode and the drain electrode of the transistor 808. Accordingly, a small amount of charge flows through the transistor 804 and the transistor 808. In other words, the off-state current is generated.

Next, a measurement period of the off-state current will be described briefly. In the measurement period, the potential of the one of the source terminal and the drain terminal of the transistor 804 (that is, the potential V2) and the potential of the other of the source terminal and the drain terminal of the transistor 808 (that is, the potential V1) are fixed to a low potential. On the other hand, the potential of the node A is not fixed (the node A is in a floating state) in the measurement period. Accordingly, charge flows through the transistor 804, and the amount of charge held in the node A changes over time. Further, as the amount of charge held in the node A changes, the potential of the node A changes. In addition, the output potential Vout of the output terminal also changes.

Figure 19:
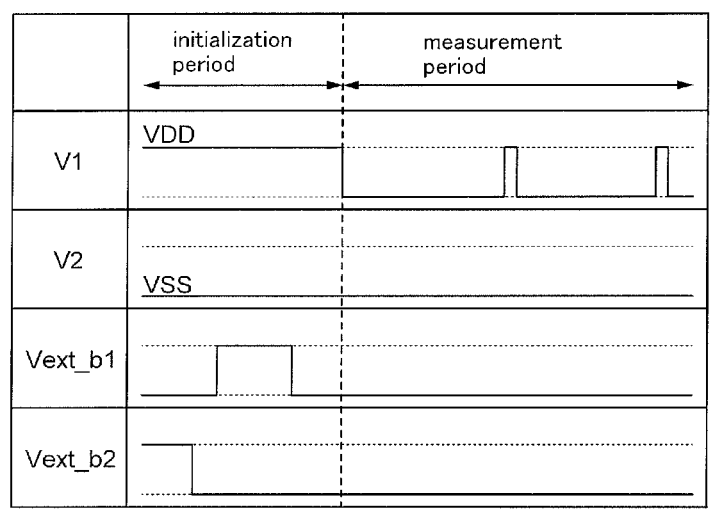
FIG. 19 is a timing chart for evaluating characteristics of a transistor including an oxide semiconductor.

FIG. 19 shows details (a timing diagram) of the relation among potentials in the initialization period in which the potential difference is generated and in the following measurement period.

In the initialization period, first, the potential Vext_b2 is set to a potential (a high potential) at which the transistor 804 is turned on. Thus, the potential of the node A comes to be V2, that is, a low potential (VSS). After that, the potential Vext_b2 is set to a potential (a low potential) at which the transistor 804 is turned off, whereby the transistor 804 is turned off. Then, the potential Vext_b1 is set to a potential (a high potential) at which the transistor 808 is turned on. Thus, the potential of the node A comes to be V1, that is, a high potential (VDD). After that, the potential Vext_b1 is set to a potential at which the transistor 808 is turned off. Thus, the node A is brought into a floating state and the initialization period is completed.

In the following measurement period, the potential V1 and the potential V2 are individually set to potentials at which charge flows to or from the node A. Here, the potential V1 and the potential V2 are set to a low potential (VSS). Note that at the timing of measuring the output potential Vout, it is necessary to operate an output circuit; thus, V1 is set to a high potential (VDD) temporarily in some cases. Note that the period in which V1 is a high potential (VDD) is set to be short so that the measurement is not influenced.

When a potential difference is generated and the measurement period is started as described above, the amount of charge held in the node A changes over time and the potential of the node A changes accordingly. This means that the potential of the gate terminal of the transistor 805 changes and the output potential Vout of the output terminal also changes over time.

A method for calculating the off-state current based on the obtained output potential Vout will be described below.

The relation between the potential $V_A$ of the node A and the output potential Vout is obtained before the off-state current is calculated, whereby the potential $V_A$ of the node A can be obtained based on the output potential Vout. From the relation described above, the potential $V_A$ of the node A can be expressed as a function of the output potential Vout by the following equation.

$$V_A = F(V\text{out})$$

Charge $Q_A$ of the node A is expressed by the following equation, with the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const}$$

Since current $I_A$ of the node A is the time derivative of charge flowing to the node A (or charge flowing from the node A), the current $I_A$ of the node A is expressed by the following equation.

$$I_A \equiv \frac{\Delta Q_A}{\Delta t} = \frac{C_A \cdot \Delta F(V\text{out})}{\Delta t}$$

Thus, the current $I_A$ of the node A can be obtained from the capacitance $C_A$ connected to the node A and the output potential Vout of the output terminal.

By the method described above, leakage current (off-state current) flowing between a source and a drain of a transistor which is in an off state can be calculated.

In this example, the transistor 804, the transistor 805, the transistor 806, and the transistor 808 with a channel length L of 10 μm and a channel width W of 50 μm were formed using a highly purified oxide semiconductor. In the measurement systems 800 arranged in parallel, capacitance values of a capacitor 802a, a capacitor 802b, and a capacitor 802c were 100 fF, 1 pF, and 3 pF, respectively.

Note that in the measurement according to this example, VDD was 5 V and VSS was 0 V. In the measurement period, Vout was measured while the potential V1 was basically set to VSS and changed to VDD only for 100 milliseconds every 10 seconds to 300 seconds. Further, Δt used in calculation of current I flowing through the element was approximately 30000 seconds.

Figure 20:
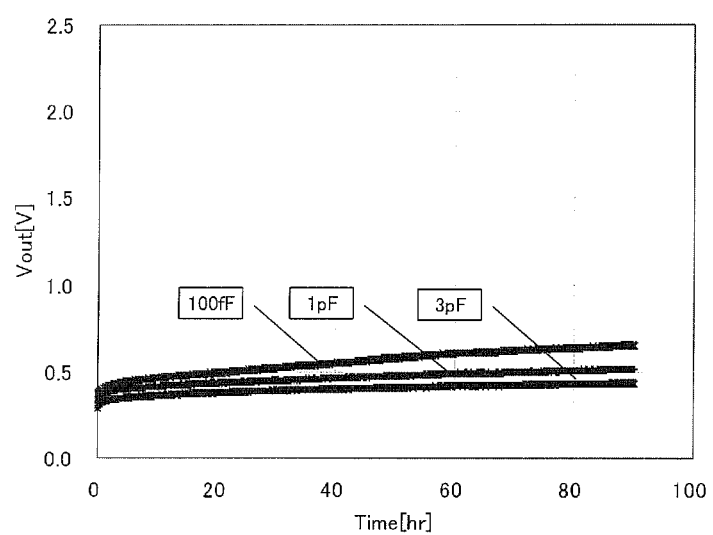
FIG. 20 is a graph showing characteristics of a transistor including an oxide semiconductor.

FIG. 20 shows the relation between the output potential Vout and elapsed time Time in the current measurement. As is seen in FIG. 20, the potential changes over time.

Figure 21:
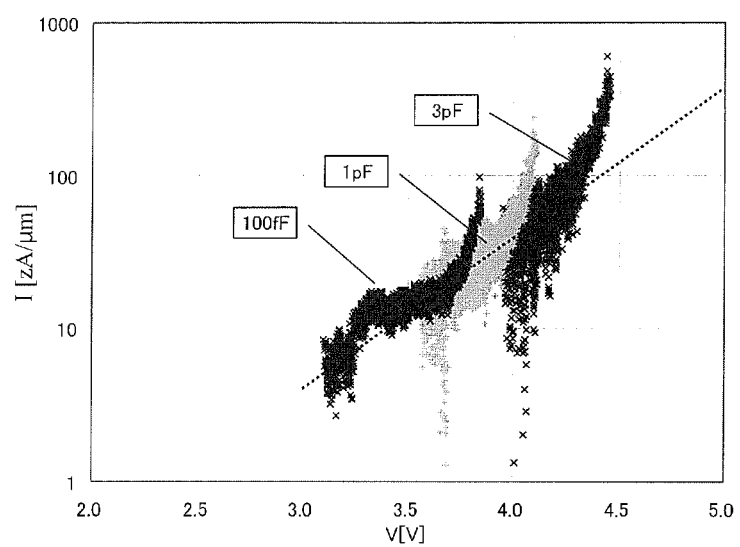
FIG. 21 is a graph showing characteristics of a transistor including an oxide semiconductor.

FIG. 21 shows the off-state current at room temperature (25° C.) calculated based on the above current measurement. FIG. 21 shows the relation between a source-drain voltage V and off-state current I. According to FIG. 21, off-state current is approximately 40 zA/μm when the source-drain voltage is 4 V. When the source-drain voltage was 3.1 V, the off-state current was smaller than or equal to 10 zA/μm. Note that 1 zA is equivalent to $10^{-21}$ A.

Figure 22:
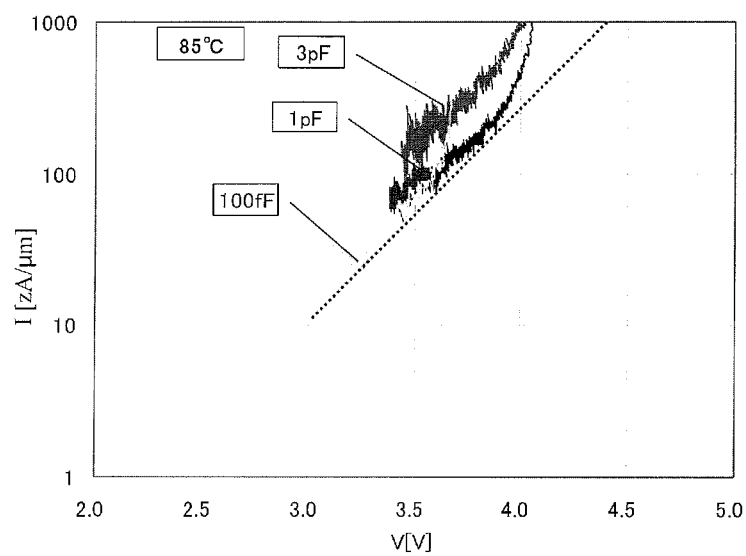
FIG. 22 is a graph showing characteristics of a transistor including an oxide semiconductor.

Further, FIG. 22 shows the off-state current in an environment at a temperature of 85° C., which was calculated based on the above current measurement. FIG. 22 shows the relation between a source-drain voltage V and off-state current I in an environment at a temperature of 85° C. According to FIG. 22, the off-state current was less than or equal to 100 zA/μm under the condition where the source-drain voltage was 3.1 V.

According to this example, it was confirmed that the off-state current is sufficiently small in a transistor including a highly purified oxide semiconductor.

Example 2

The number of times the semiconductor device according to one embodiment of the disclosed invention can rewrite data was examined. In this example, the examination results will be described with reference to FIG. 23.

A semiconductor device used for the examination is the semiconductor device having the circuit structure in FIG. 1A-1. Here, an oxide semiconductor was used for a transistor corresponding to the transistor 162, and a capacitor with a capacitance value of 0.33 pF was used as a capacitor corresponding to the capacitor 164.

The examination was performed by comparing the initial memory window width and the memory window width after storing and writing of data were repeated a predetermined number of times. Data was stored and written by applying 0 V or 5 V to a wiring corresponding to the third wiring in FIG. 1A-1 and applying 0 V or 5 V to a wiring corresponding to the fourth wiring. When the potential of the wiring corresponding to the fourth wiring is 0 V, the transistor (the writing transistor) corresponding to the transistor 162 is in an off state; thus, a potential applied to a node FG is held. When the potential of the wiring corresponding to the fourth wiring is 5 V, the transistor corresponding to the transistor 162 is in an on state; thus, a potential of the wiring corresponding to the third wiring is applied to the node FG.

The memory window width is one of the indicators of the memory device characteristics. Here, the memory window width refers to the shift amount ΔVcg in curves (Vcg-Id curves) between different memory states, which show the relation between a potential Vcg of a wiring corresponding to the fifth wiring and a drain current Id of a transistor (a reading transistor) corresponding to the transistor 160. The different memory states are a state where 0 V is applied to the node FG (hereinafter referred to as a Low state) and a state where 5 V is applied to the node FG (hereinafter referred to as a High state). That is, the memory window width can be obtained by sweeping the potential Vcg in the Low state and in the High state.

Figure 23:
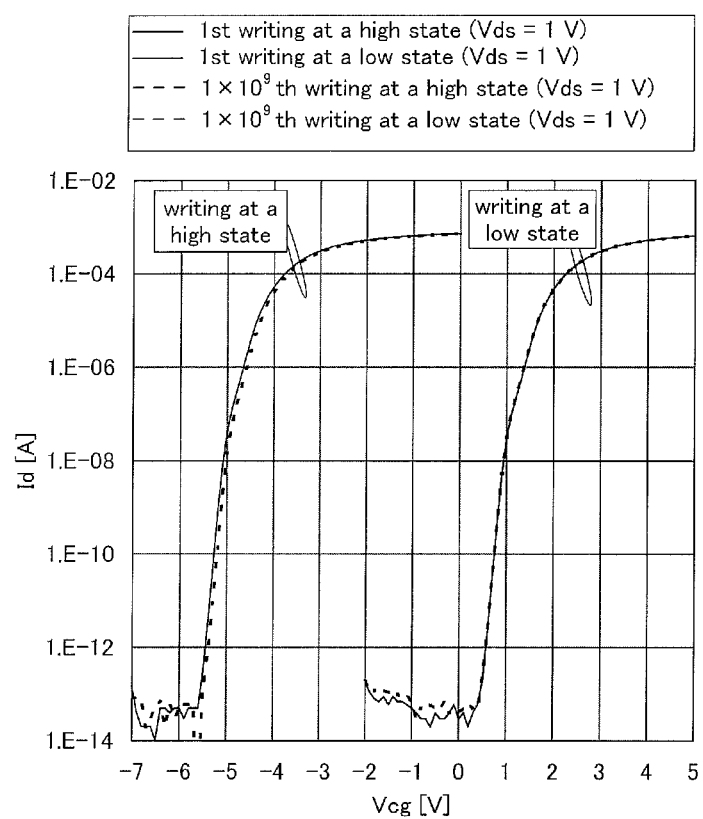
FIG. 23 is a graph showing examination results of a memory window width.

FIG. 23 shows the examination results of the initial memory window width and the memory window width after writing was performed $1 \times 10^9$ times. Note that in FIG. 23, the horizontal axis represents Vcg (V) and the vertical axis represents Id (A). According to FIG. 23, the memory window width is not changed by $1 \times 10^9$ times of data writing, which means that at least during the period in which data is written $1 \times 10^9$ times, the semiconductor device does not deteriorate.

As described above, a semiconductor device according to one embodiment of the disclosed invention has very high rewriting durability and its characteristics do not change even when data is held and written $10^9$ times. That is, it can be said that a semiconductor device having excellent reliability is realized according to one embodiment of the disclosed invention.

This application is based on Japanese Patent Application serial no. 2010-028818 filed with Japan Patent Office on Feb. 12, 2010, the entire contents of which are hereby incorporated by reference.

EXPLANATION OF REFERENCE

100: substrate, 102: protective layer, 104: semiconductor region, 106: element isolation insulating layer, 108: gate insulating layer, 110: gate electrode, 116: channel formation region, 120: impurity region, 122: metal layer, 124: metal compound region, 128: insulating layer, 130: insulating layer, 142a: source or drain electrode, 142b: source or drain electrode, 143a: insulating layer, 143b: insulating layer, 144: oxide semiconductor layer, 146: gate insulating layer, 148a: gate electrode, 1486: electrode, 150: insulating layer, 152: insulating layer, 154: electrode, 156: wiring, 160: transistor, 162: transistor, 164: capacitor, 166: transistor, 200: capacitor, 201: transistor, 202: transistor, 203: transistor, 310: transistor, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power switch, 733: operation key, 735: speaker, 737: hinge, 740: housing, 741: housing, 742: display panel, 743: speaker, 744: microphone, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television device, 771: housing, 773: display portion, 775: stand, 780: remote controller, 800: measurement system, 802: capacitor, 802a: capacitor, 802b: capacitor, 802c: capacitor, 804: transistor, 805: transistor, 806: transistor, 808: transistor, 1000: memory cell, and 1100: potential converter circuit

The invention claimed is:

1. A semiconductor device comprising:
   a first signal line;
   a second signal line;
   a memory cell; and
   a circuit,
   wherein the memory cell comprises:
      a first transistor comprising a first gate electrode, a first source electrode, a first drain electrode, and a first channel formation region including a first semiconductor;
      a second transistor comprising a second gate electrode, a second source electrode, a second drain electrode, and a second channel formation region including a second semiconductor; and
      a first capacitor,
   wherein the first semiconductor is different from the second semiconductor,
   wherein the second drain electrode, an electrode of the first capacitor, and the first gate electrode are electrically connected to one another,
   wherein the second gate electrode is electrically connected to the circuit through the second signal line,
   wherein the second source electrode is electrically connected to the first signal line,
   and
   wherein the circuit is configured to output a second potential higher than a first potential to the second signal line in a case where the first potential is input to the circuit.

2. The semiconductor device according to claim 1, wherein the second semiconductor is an oxide semiconductor.

3. The semiconductor device according to claim 1,
   wherein the circuit comprises:
      a first wiring;
      a second wiring;
      a third wiring;
      a third transistor comprising a third gate electrode, a third source electrode, a third drain electrode, and a third channel formation region including a third semiconductor;

a fourth transistor comprising a fourth gate electrode, a fourth source electrode, a fourth drain electrode, and a fourth channel formation region including a fourth semiconductor; and
a second capacitor,
wherein the second signal line, a first electrode of the second capacitor, and one of the fourth source electrode and the fourth drain electrode are electrically connected to one another,
wherein a second electrode of the second capacitor and one of the third source electrode and the third drain electrode are electrically connected to each other,
wherein the other one of the third source electrode and the third drain electrode and the first wiring are electrically connected to each other,
wherein the third gate electrode, the other one of the fourth source electrode and the fourth drain electrode, and the second wiring are directly connected to one another,
wherein the fourth gate electrode and the third wiring are electrically connected to each other,
wherein the first wiring is provided so as to be supplied with a power supply potential, and
wherein the second wiring is provided so as to be supplied with a power supply potential.

4. The semiconductor device according to claim 3, wherein the third semiconductor and the fourth semiconductor are each different from the second semiconductor.

5. The semiconductor device according to claim 3, wherein the third semiconductor and the fourth semiconductor are each an oxide semiconductor.

6. The semiconductor device according to claim 3,
wherein the circuit further comprises:
a fifth transistor comprising a fifth gate electrode, a fifth source electrode, a fifth drain electrode, and a fifth channel formation region; and
a fourth wiring,
wherein one of the fifth source electrode and the fifth drain electrode and the second signal line are electrically connected to each other,
wherein the other one of the fifth source electrode and the fifth drain electrode is grounded, and
wherein the fifth gate electrode and the fourth wiring are electrically connected to each other.

7. The semiconductor device according to claim 2, wherein the oxide semiconductor is an In—Ga—Zn—O based oxide semiconductor.

8. The semiconductor device according to claim 1, wherein a capacitance of the first capacitor is larger than or equal to a capacitance of the first transistor.

9. A semiconductor device comprising:
a first signal line;
a second signal line;
a source line;
a word line;
a bit line;
a memory cell; and
a circuit,
wherein the memory cell comprises:
a first transistor comprising a first gate electrode, a first source electrode, a first drain electrode, and a first channel formation region including a first semiconductor;
a second transistor comprising a second gate electrode, a second source electrode, a second drain electrode, and a second channel formation region including a second semiconductor; and
a first capacitor,
wherein the first semiconductor is different from the second semiconductor,
wherein the second drain electrode, one electrode of the first capacitor, and the first gate electrode are electrically connected to one another,
wherein the second gate electrode is electrically connected to the circuit through the second signal line,
wherein the second source electrode is electrically connected to the first signal line,
wherein the other electrode of the first capacitor is electrically connected to the word line,
wherein the first source electrode is electrically connected to the source line,
wherein the first drain electrode is electrically connected to the bit line, and
wherein the circuit is configured to output a second potential higher than a first potential to the second signal line in a case where the first potential is input to the circuit.

10. The semiconductor device according to claim 9, wherein the second semiconductor is an oxide semiconductor.

11. The semiconductor device according to claim 9,
wherein the circuit comprises:
a first wiring;
a second wiring;
a third wiring;
a third transistor comprising a third gate electrode, a third source electrode, a third drain electrode, and a third channel formation region including a third semiconductor;
a fourth transistor comprising a fourth gate electrode, a fourth source electrode, a fourth drain electrode, and a fourth channel formation region including a fourth semiconductor; and
a second capacitor,
wherein the second signal line, a first electrode of the second capacitor, and one of the fourth source electrode and the fourth drain electrode are electrically connected to one another,
wherein a second electrode of the second capacitor and one of the third source electrode and the third drain electrode are electrically connected to each other,
wherein the other one of the third source electrode and the third drain electrode and the first wiring are electrically connected to each other,
wherein the third gate electrode, the other one of the fourth source electrode and the fourth drain electrode, and the second wiring are directly connected to one another,
wherein the fourth gate electrode and the third wiring are electrically connected to each other,
wherein the first wiring is provided so as to be supplied with a power supply potential, and
wherein the second wiring is provided so as to be supplied with a power supply potential.

12. The semiconductor device according to claim 11, wherein the third semiconductor and the fourth semiconductor are each different from the second semiconductor.

13. The semiconductor device according to claim 11, wherein the third semiconductor and the fourth semiconductor are each an oxide semiconductor.

14. The semiconductor device according to claim 11,
wherein the circuit further comprises:
a fifth transistor comprising a fifth gate electrode, a fifth source electrode, a fifth drain electrode, and a fifth channel formation region; and a fourth wiring,
wherein one of the fifth source electrode and the fifth drain electrode and the second signal line are electrically connected to each other,
wherein the other one of the fifth source electrode and the fifth drain electrode is grounded, and
wherein the fifth gate electrode and the fourth wiring are electrically connected to each other.

15. The semiconductor device according to claim 10, wherein the oxide semiconductor is an In—Ga—Zn—O based oxide semiconductor.

16. The semiconductor device according to claim 9, wherein a capacitance of the first capacitor is larger than or equal to a capacitance of the first transistor.

17. A semiconductor device comprising:
a signal line;
a memory cell; and
a circuit,
wherein the memory cell comprises:
a first transistor;
a second transistor comprising a channel formation region including an oxide semiconductor; and
a first capacitor,
wherein a first terminal of the second transistor, a terminal of the first capacitor, and a gate terminal of the first transistor are electrically connected to one another, and
wherein a gate terminal of the second transistor is electrically connected to the signal line, and
wherein the circuit comprises:
a first wiring;
a third transistor, wherein a first terminal of the third transistor is electrically connected to the first wiring;
a second capacitor, wherein a first terminal of the second capacitor, a second terminal of the third transistor, and the signal line are electrically connected to one another;
a fourth transistor, wherein a first terminal of the fourth transistor is electrically connected to a second terminal of the second capacitor; and
a second wiring electrically connected to a second terminal of the fourth transistor,
wherein a gate terminal of the fourth transistor is directly connected to the first wiring,
wherein the first wiring is provided so as to be supplied with a power supply potential, and
wherein the second wiring is provided so as to be supplied with a power supply potential.

18. The semiconductor device according to claim 17, wherein the circuit further comprises a fifth transistor, and wherein a first terminal of the fifth transistor is electrically connected to the signal line.

19. The semiconductor device according to claim 17, wherein a gate terminal of the fourth transistor is electrically connected to the first wiring.

20. The semiconductor device according to claim 17, wherein the oxide semiconductor is an In—Ga—Zn—O based oxide semiconductor.

21. The semiconductor device according to claim 17, wherein the first terminal of the third transistor is electrically connected to a gate terminal of the fourth transistor.

22. The semiconductor device according to claim 17, wherein a capacitance of the first capacitor is larger than or equal to a capacitance of the first transistor.

23. A method for driving a semiconductor device, comprising:
selecting an on state or an off state of a second transistor to hold charge in a node where a gate electrode of a first transistor, one of a source electrode and a drain electrode of the second transistor, and an electrode of a first capacitor are electrically connected to one another,
wherein in a case where a potential is supplied to the node, a potential supplied to a gate electrode of the second transistor is higher than a power supply potential,
wherein the second transistor comprises a channel formation region including an oxide semiconductor,
wherein a method for supplying the potential supplied to the gate electrode of the second transistor through a first line comprises:
a first period where a potential, configured to make a fourth transistor an on state, is applied to a gate electrode of the fourth transistor; and
a second period where a potential, configured to make the fourth transistor an off state, is applied to the gate electrode of the fourth transistor and a potential is applied to a second line electrically connected to one of a source electrode and a drain electrode of a third transistor so as to bootstrap a potential of the first line after the first period,
wherein one of a source electrode and a drain electrode of the forth transistor and a first electrode of a second capacitor are electrically connected to the first line,
wherein a second electrode of the second capacitor is electrically connected to the other of the source electrode and the drain electrode of the third transistor, and
wherein the other of the source electrode and the drain electrode of the fourth transistor is directly connected to a gate electrode of the third transistor.

24. The method for driving a semiconductor device according to claim 23, wherein the potential supplied to the gate electrode of the second transistor is higher than a potential which is obtained by addition of a threshold voltage of the second transistor to the power supply potential.

25. The semiconductor device according to claim 1, wherein the circuit is configured to output a low potential to the second signal line in a case where the low potential is input to the circuit, and
wherein the first potential is a high potential.

26. The semiconductor device according to claim 9, wherein the circuit is configured to output a low potential to the second signal line in a case where the low potential is input to the circuit, and
wherein the first potential is a high potential.

27. The method for driving a semiconductor device according to claim 23, wherein the potential supplied to the node is a high potential.

* * * * *